US010892322B2

(12) United States Patent
Yang et al.

(10) Patent No.: US 10,892,322 B2
(45) Date of Patent: Jan. 12, 2021

(54) CIRCUITS EMPLOYING A DOUBLE DIFFUSION BREAK (DDB) AND SINGLE DIFFUSION BREAK (SDB) IN DIFFERENT TYPE DIFFUSION REGION(S), AND RELATED FABRICATION METHODS

(71) Applicant: QUALCOMM Incorporated, San Diego, CA (US)

(72) Inventors: Haining Yang, San Diego, CA (US); Jie Deng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,170

(22) Filed: Sep. 21, 2018

(65) Prior Publication Data
US 2020/0098858 A1    Mar. 26, 2020

(51) Int. Cl.
| H01L 29/06 | (2006.01) |
| H01L 21/265 | (2006.01) |
| H01L 21/266 | (2006.01) |
| H01L 21/3065 | (2006.01) |
| H01L 21/8234 | (2006.01) |
| H01L 27/118 | (2006.01) |
| H01L 29/40 | (2006.01) |

(Continued)

(52) U.S. Cl.
CPC ........ *H01L 29/0649* (2013.01); *H01L 21/266* (2013.01); *H01L 21/26513* (2013.01); *H01L 21/3065* (2013.01); *H01L 21/823431* (2013.01); *H01L 27/11807* (2013.01); *H01L 29/401* (2013.01); *H01L 29/66545* (2013.01); *H01L 29/7851* (2013.01)

(58) Field of Classification Search
None
See application file for complete search history.

(56) References Cited

U.S. PATENT DOCUMENTS 8,674,413 B1    3/2014 Chi
9,337,099 B1 *  5/2016 Jain ................... H01L 21/82341
(Continued)

OTHER PUBLICATIONS

Invitation to Pay Additional Fees and Partial International Search for PCT/US2019/047013, dated Nov. 25, 2019, 14 pages.
(Continued)

*Primary Examiner* — Michelle Mandala
(74) *Attorney, Agent, or Firm* — Withrow & Terranova, PLLC

(57) ABSTRACT

Aspects disclosed herein include circuits employing a double diffusion break (DDB) and a single diffusion break (SDB) in different type diffusion regions, and related fabrication methods are disclosed. In exemplary aspects disclosed herein, either a DDB or a SDB is formed in the N-type diffusion region(s) and the opposing type diffusion, either a SDB or DDB, is formed in the P-type diffusion region(s). Forming different diffusion breaks between a DDB and a SDB in different diffusion regions of the circuit can be employed to induce channel strain that will increase carrier mobility of either P-type or N-type semiconductor devices formed in respective P-type or N-type diffusion region(s), while avoiding or reducing such induced channel strain in either P-type or N-type semiconductor devices formed in respective P- or N-type diffusion region(s) that may degrade carrier mobility.

18 Claims, 22 Drawing Sheets

(51) Int. Cl.
*H01L 29/66* (2006.01)
*H01L 29/78* (2006.01)

(56) References Cited

U.S. PATENT DOCUMENTS

| | | |
|---|---|---|
| 9,412,616 B1 | 8/2016 | Xie et al. |
| 9,570,442 B1 | 2/2017 | Liu et al. |
| 9,589,845 B1 | 3/2017 | Jagannathan et al. |
| 9,831,272 B2 | 11/2017 | Chen et al. |
| 9,865,704 B2 | 1/2018 | Xie et al. |
| 10,083,964 B1 | 9/2018 | Reznicek et al. |
| 10,388,652 B2 | 8/2019 | Shi et al. |
| 10,622,479 B1 | 4/2020 | Yang |
| 2015/0054089 A1 | 2/2015 | Hong et al. |
| 2017/0062475 A1 | 3/2017 | Song et al. |
| 2017/0287933 A1* | 10/2017 | Chen .................. H01L 29/0649 |
| 2017/0358565 A1 | 12/2017 | Hensel et al. |
| 2018/0006035 A1 | 1/2018 | Yuan et al. |
| 2018/0083036 A1 | 3/2018 | Agarwal et al. |

OTHER PUBLICATIONS

International Search Report and Written Opinion for PCT/US2019/047013, dated Jan. 24, 2020, 18 pages.

Yang, H.S. et al., "Dual Stress Liner for High Performance sub-45nm Gate Length SOI CMOS Manufacturing," IEDM Technical Digest, IEEE International Electron Devices Meeting, 2004, pp. 1075-1077.

* cited by examiner

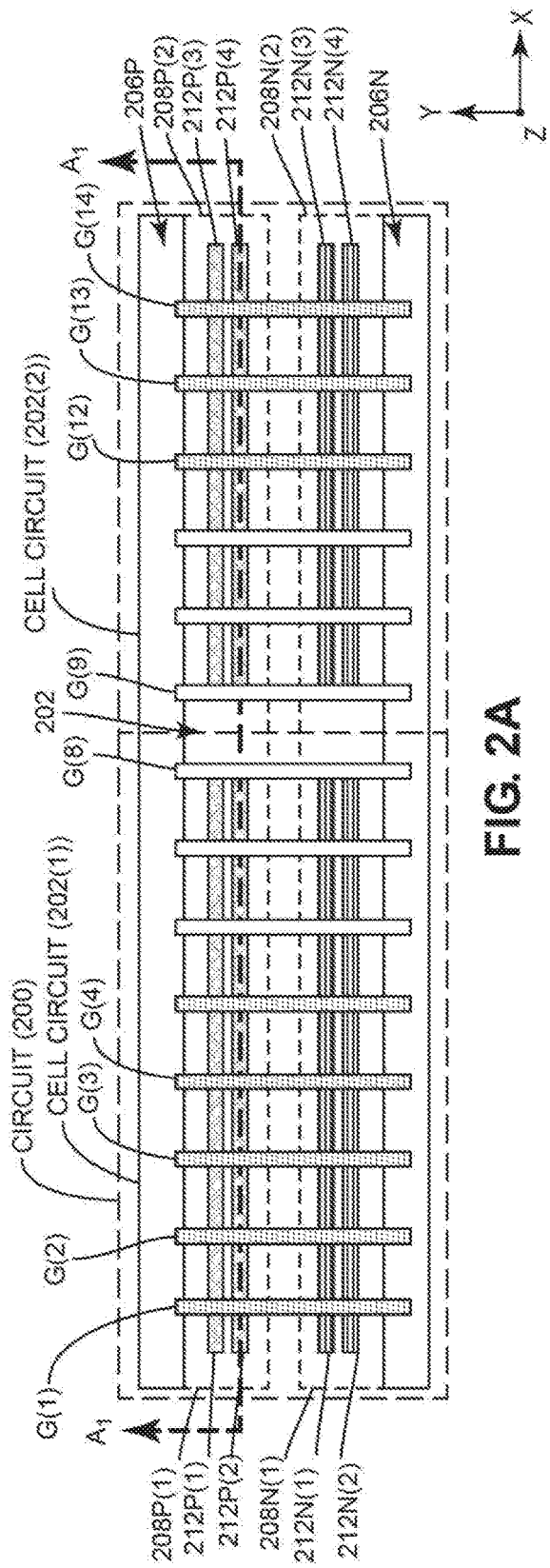
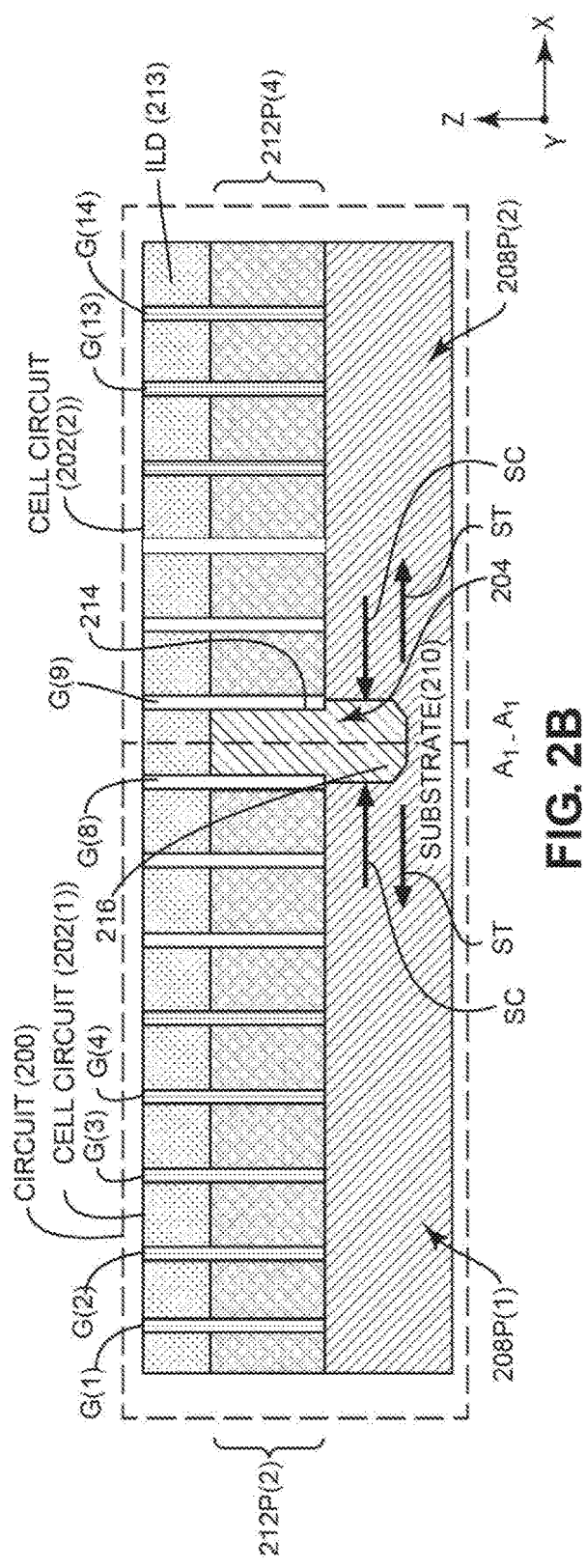
FIG. 2A
FIG. 2B

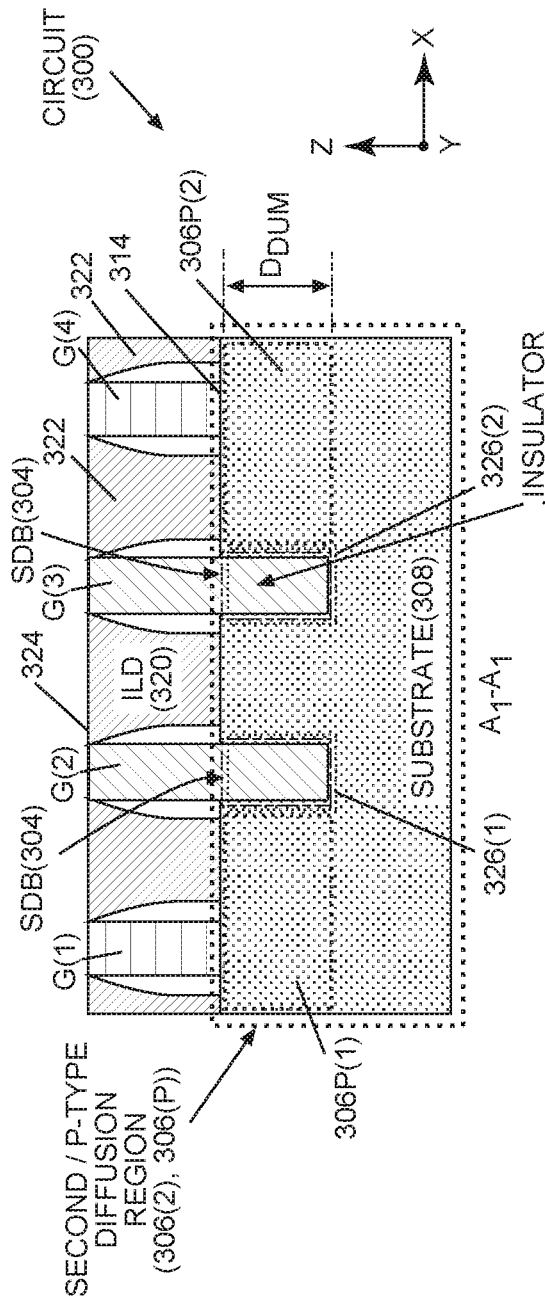
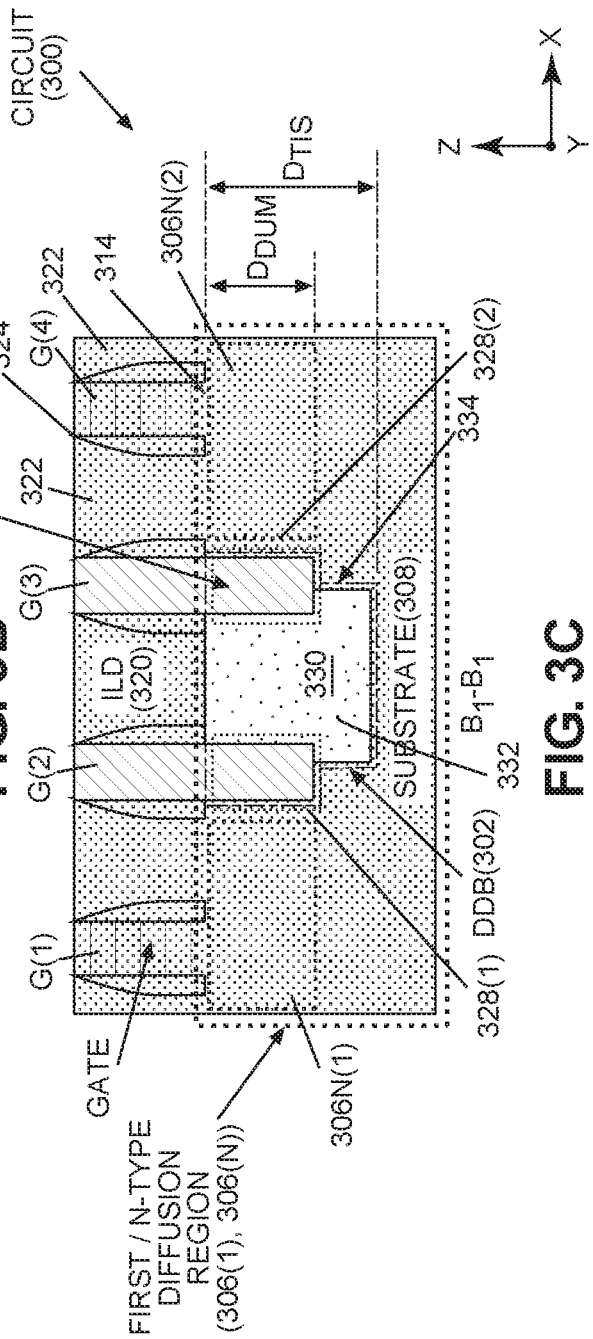
FIG. 3B
FIG. 3C

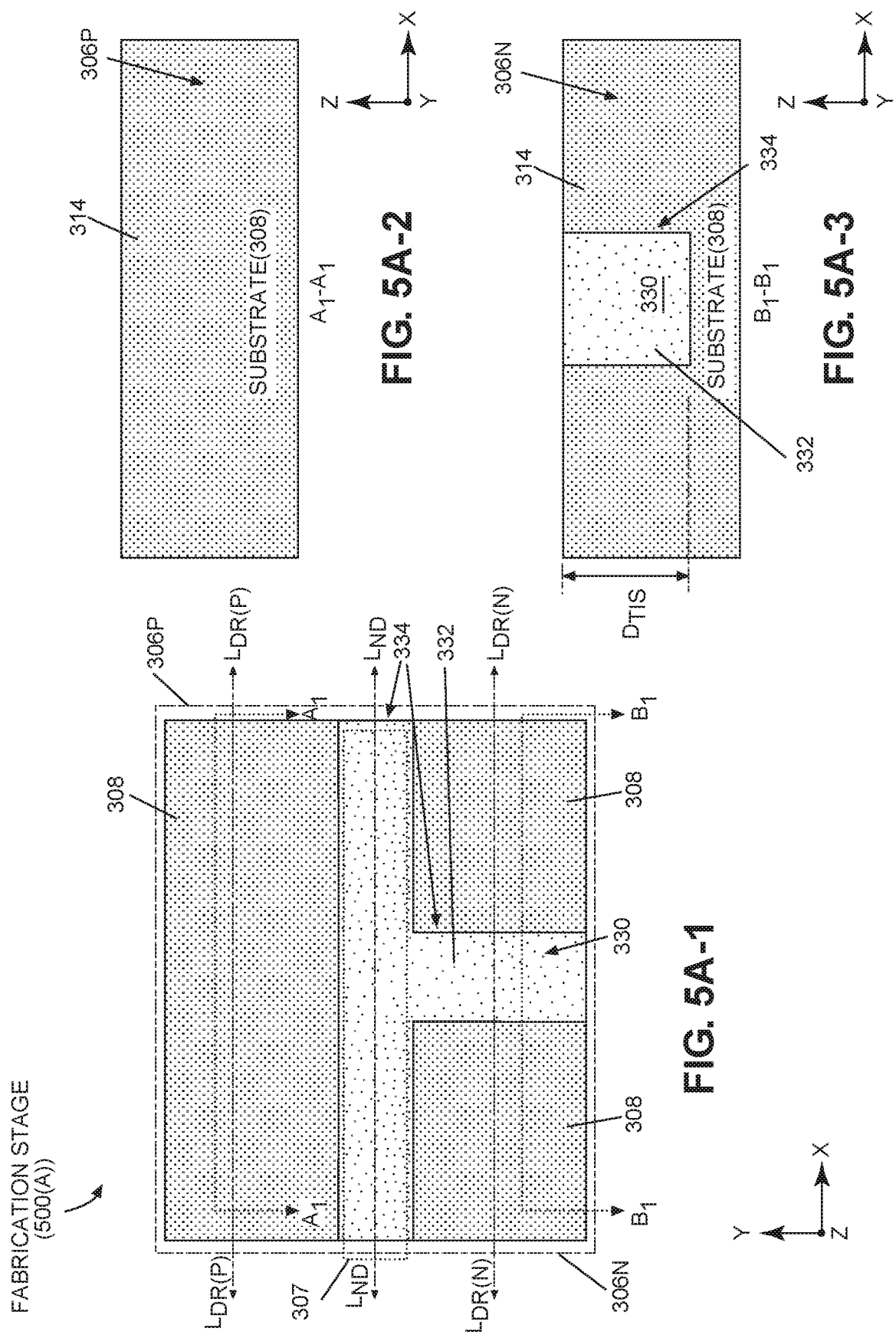

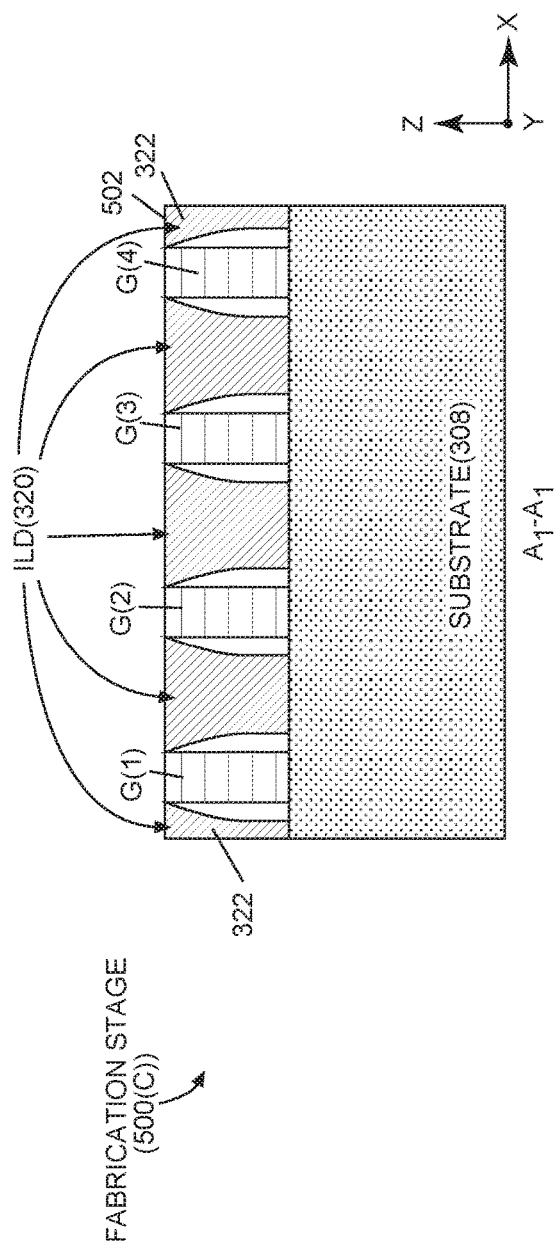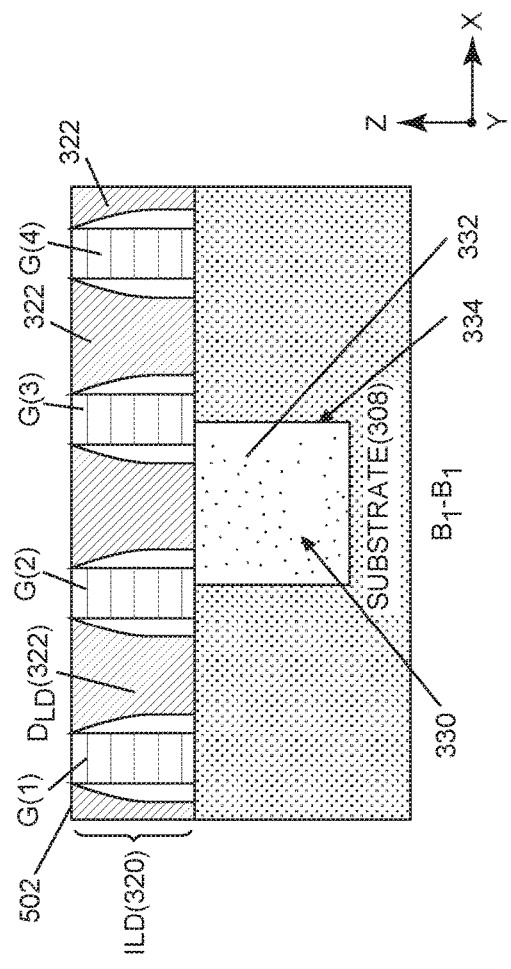

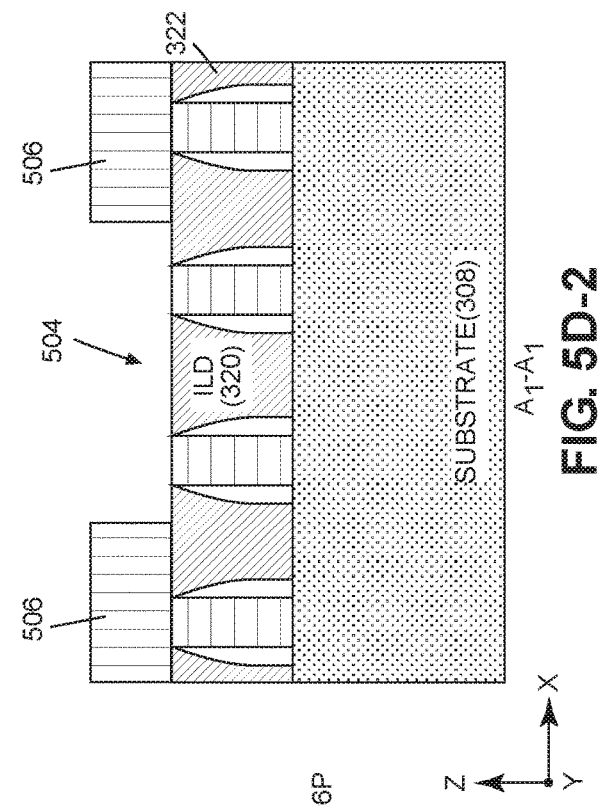
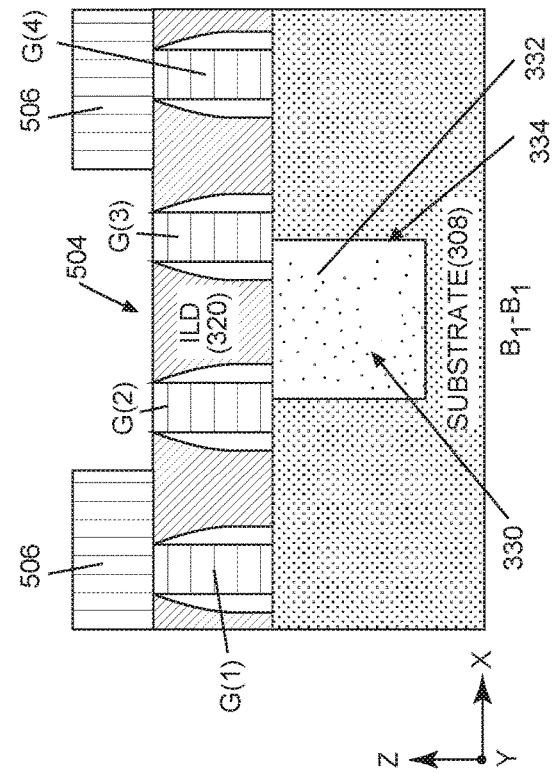
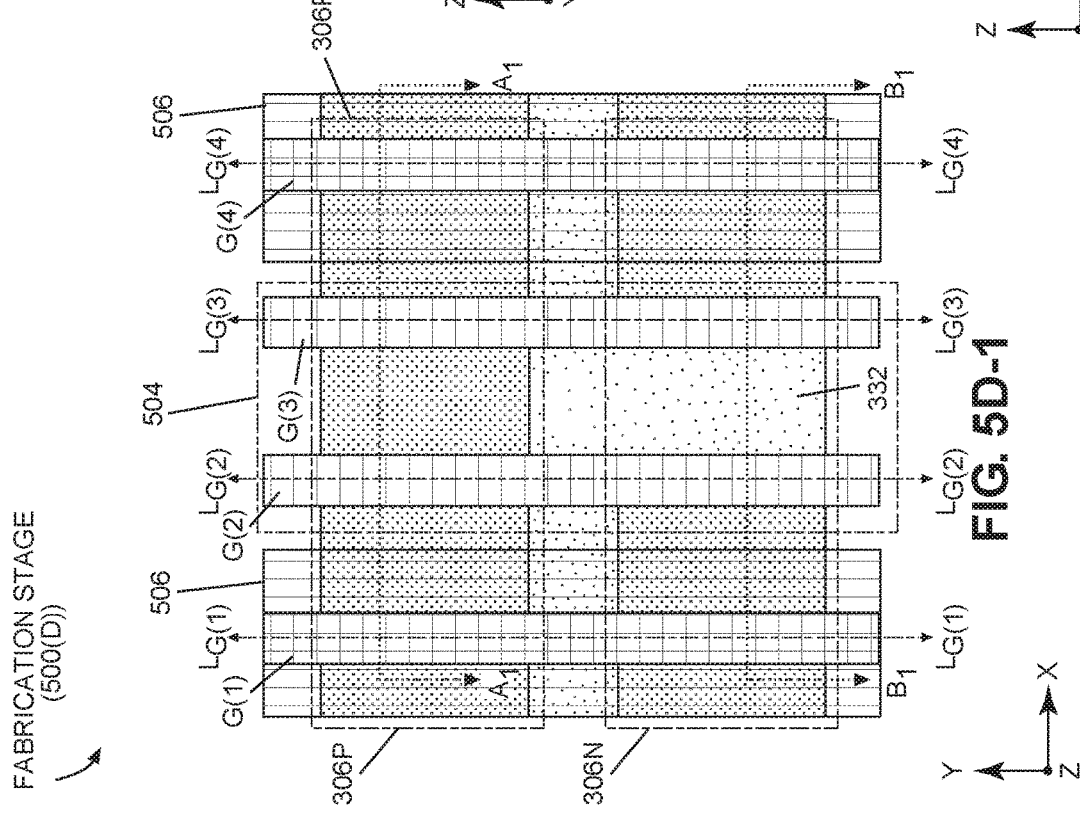

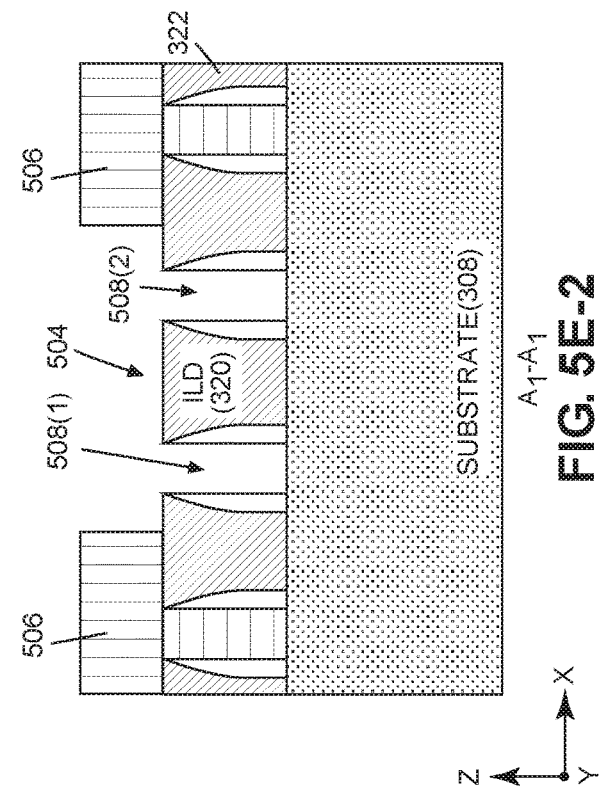
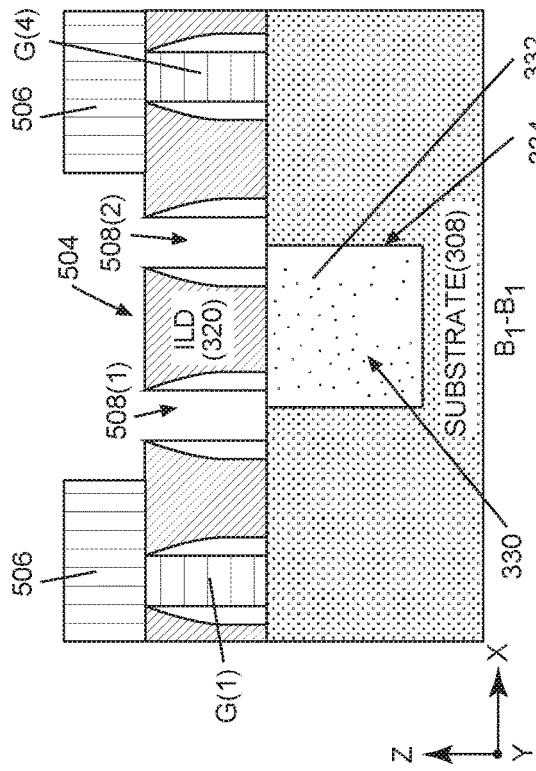
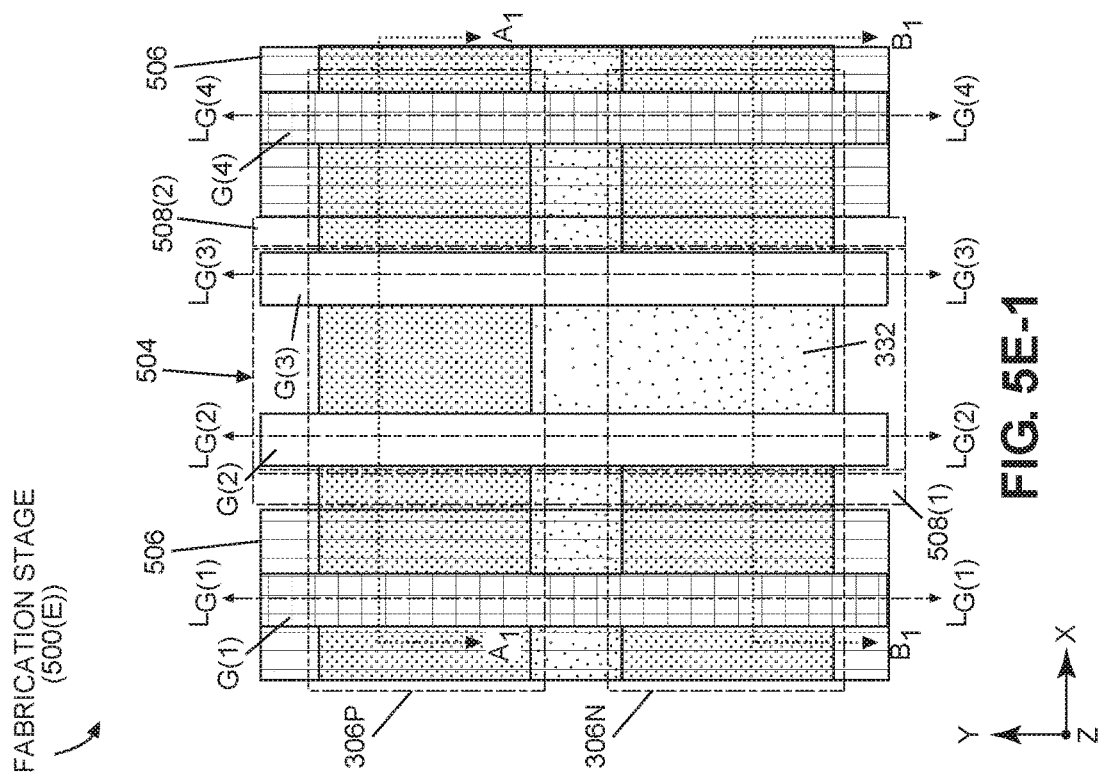

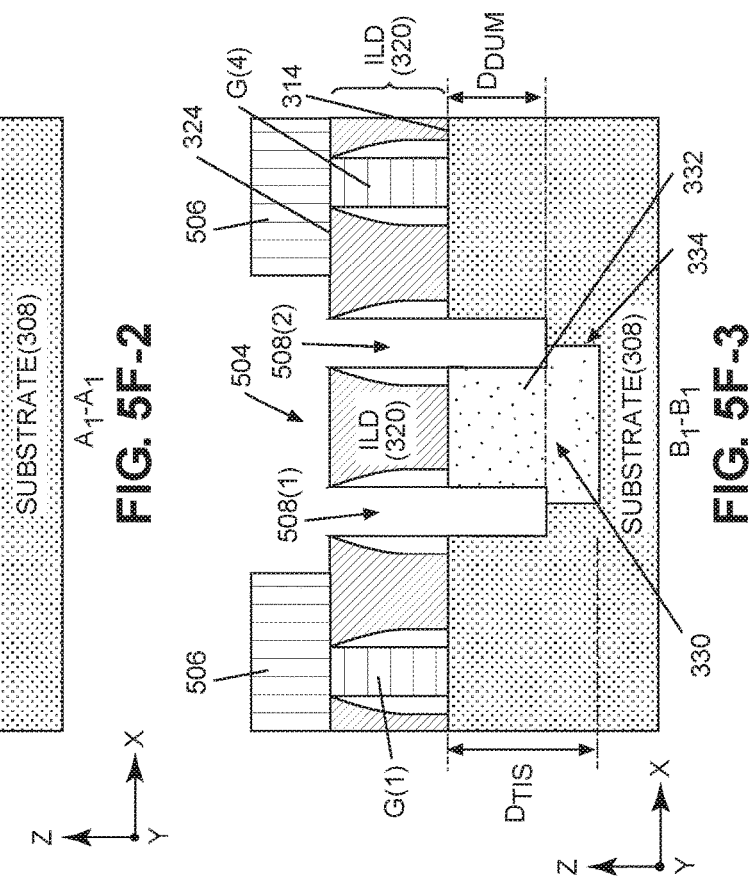
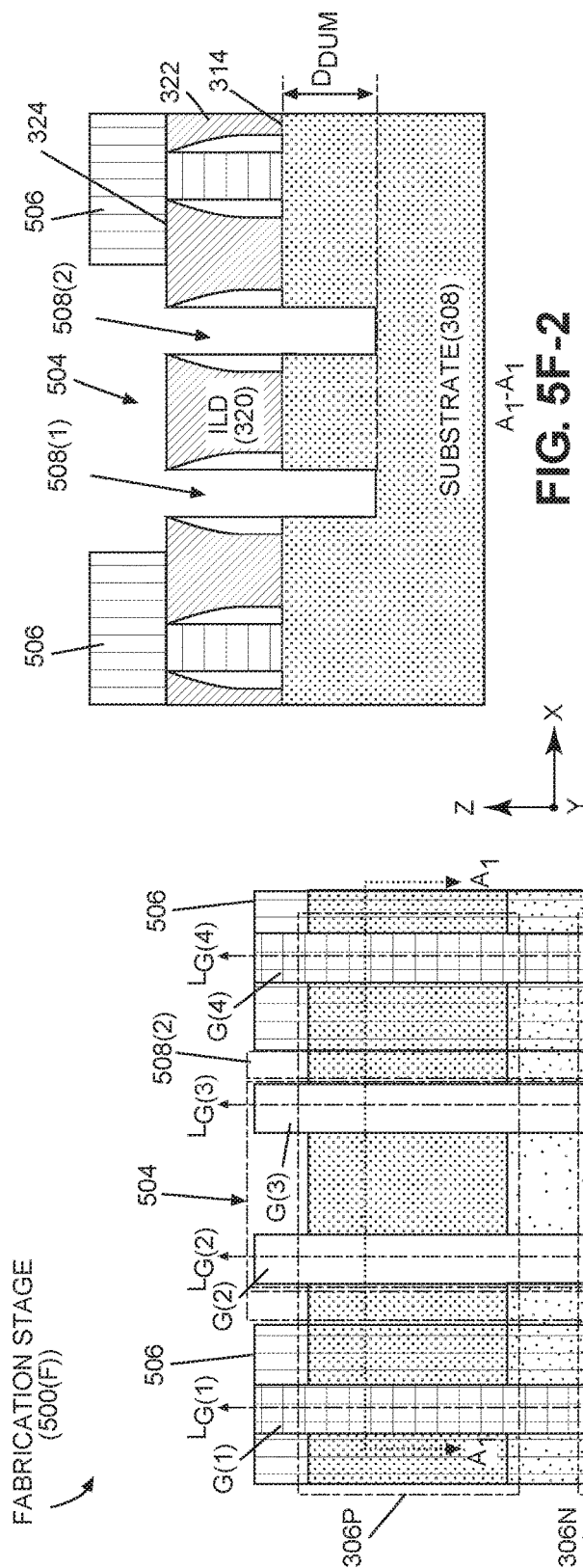
FIG. 5F-2
FIG. 5F-3
FIG. 5F-1

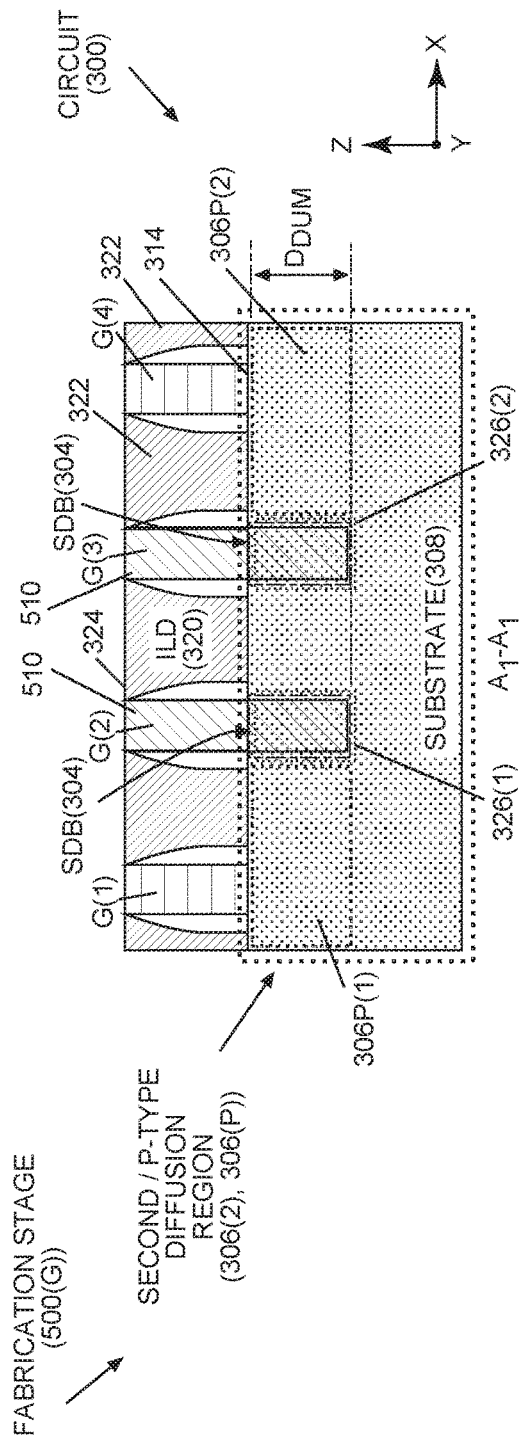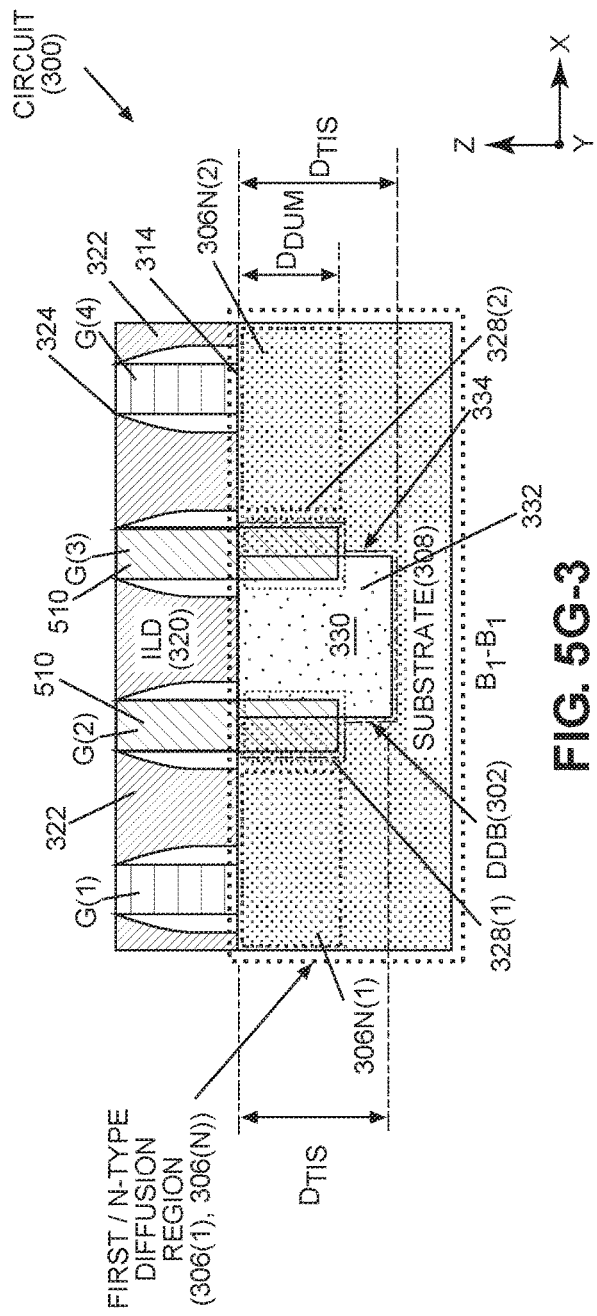
FIG. 5G-2
FIG. 5G-3

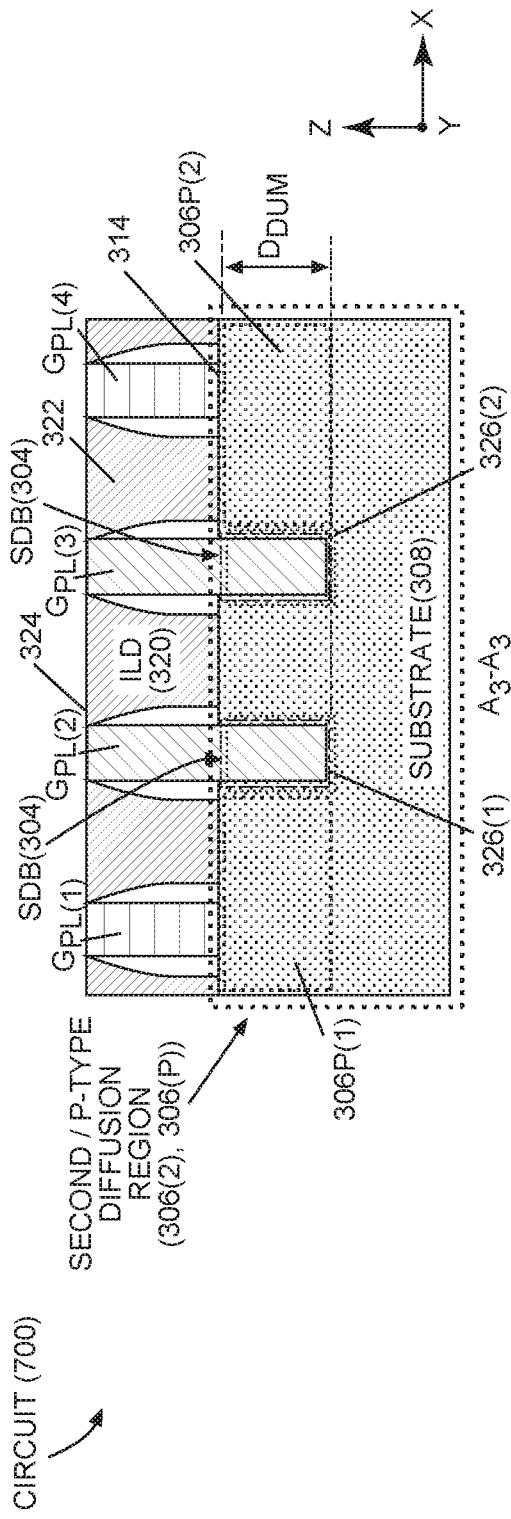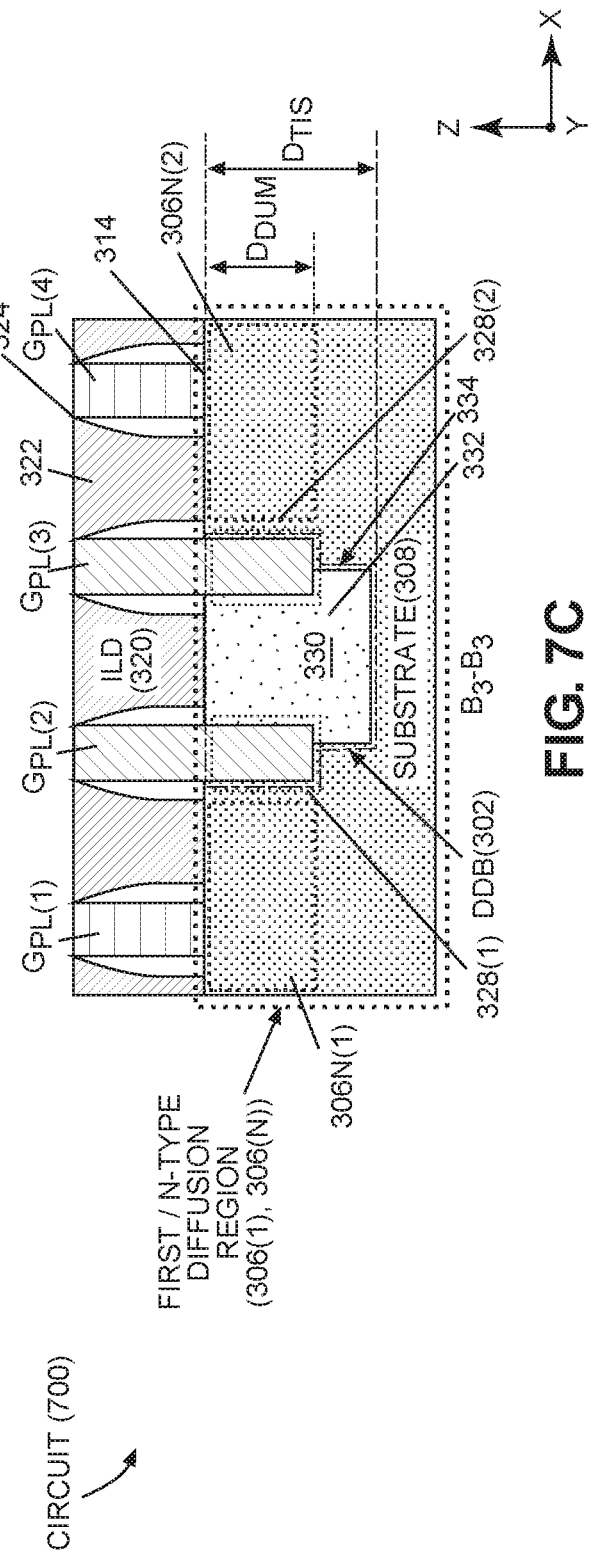

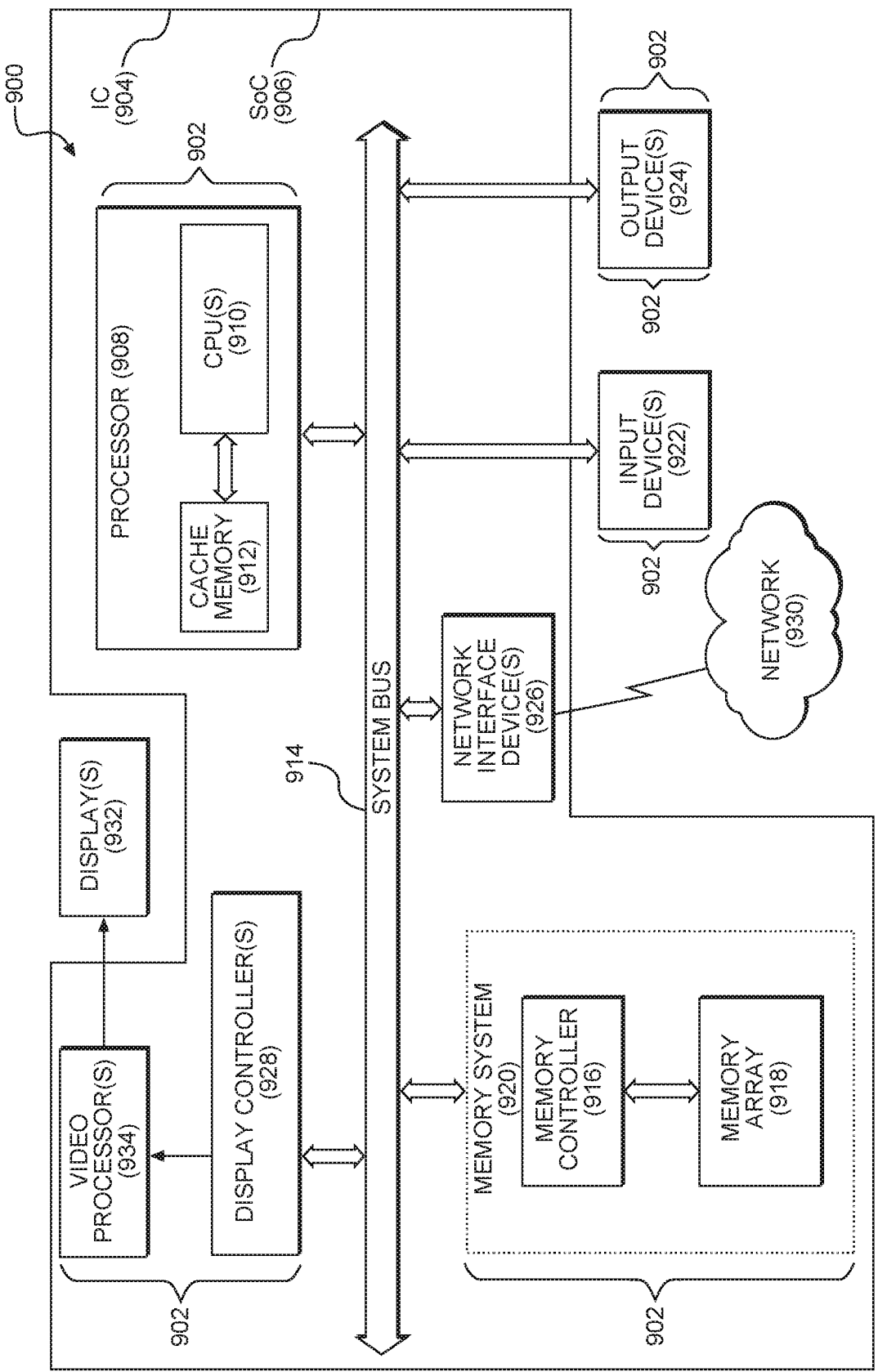

US 10,892,322 B2

CIRCUITS EMPLOYING A DOUBLE DIFFUSION BREAK (DDB) AND SINGLE DIFFUSION BREAK (SDB) IN DIFFERENT TYPE DIFFUSION REGION(S), AND RELATED FABRICATION METHODS

BACKGROUND

I. Field of the Disclosure

The field of the disclosure relates to complementary metal oxide semiconductor (CMOS) integrated circuits that include both P-type and N-type diffusion regions for forming CMOS circuits, and more particularly to use of diffusion breaks between circuits to provide isolation between circuits.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

For example, one type of transistor is a Fin Field-Effect transistor (FET) (FinFET) that provides a conducting channel via a "Fin" formed from a substrate. FIG. 1 illustrates an exemplary FinFET 100. The FinFET 100 includes a substrate 102 and a fin 104 formed from the substrate 102. The fin 104 is formed from a semiconductor material. The fin 104 may be formed from the semiconductor substrate 102 by lithography and etching processes to form raised fins 104 from the material of the substrate 102. An oxide layer 106 is included on either side of the fin 104. The FinFET 100 includes a source 108 and a drain 110 interconnected by the fin 104 such that an interior portion of the fin 104 serves as a semiconductor channel 112 between the source 108 and drain 110. The fin 104 is surrounded by a "wrap-around" gate 114. The wrap-around structure of the gate 114 provides better electrostatic control over the semiconductor channel 112, and thus helps reduce the leakage current and overcoming other short channel effects (SCEs).

Transistors, such as FinFETs, can be used to form complementary metal oxide semiconductor (CMOS) circuits in integrated circuits (ICs). For example, FIG. 2A below is a top view of a circuit 200 that includes adjacent cell circuits 202(1), 202(2), which are each an IC, that support the formation of semiconductor devices, such as the FinFET 100 in FIG. 1. FIG. 2B is a cross-sectional side view of the cell circuits 202(1), 202(2) across an $A_1$-$A_1$ break line. The individual cell circuits 202(1), 202(2) are isolated from each other by a diffusion break 204. As shown in FIG. 2A, the cell circuits 202(1), 202(2) include a layout on X-axis and Y-axis dimensions that includes a shared top power rail 206P and a shared bottom power rail 206N elongated in a direction of the X-axis. The cell circuits 202(1), 202(2) include respective P-type semiconductor diffusion regions ("P-type diffusion regions") 208P(1), 208P(2) and N-type semiconductor diffusion regions ("N-type diffusion regions") 208N(1), 208N(2) formed in a semiconductor substrate 210 ("substrate"), as shown in FIG. 2B, to provide active areas for forming semiconductor devices, such as transistors. The P-type diffusion regions 208P(1), 208P(2) and N-type diffusion regions 208N(1), 208N(2) may be formed by doping P-type and N-type materials in the substrate 210. The diffusion break 204 is needed when a different bias voltage is applied to the respective P-type or N-type diffusion region 208P(1), 208P(2) and/or 208N(1), 208N(2); otherwise, electrical isolation is needed. The P-type diffusion regions 208P(1), 208P(2) are formed as one diffusion region, but are isolated by the diffusion break 204. Likewise, the N-type diffusion regions 208N(1), 208N(2) are formed as one diffusion region, but are isolated by the diffusion break 204. The cell circuits 202(1), 202(2) also include respective P-type semiconductor channel structures 212P(1)-212P(4) and N-type semiconductor channel structures 212N(1)-212N(4) formed from semiconductor materials between the top and bottom power rails 206P, 206N. For example, the P-type and N-type semiconductor channel structures 212P(1)-212P(4), 212N(1)-212N(4) may be semiconductor Fins, also known as "Fins" for forming three-dimensional (3D) channel structures. The respective P-type semiconductor channel structures 212P(1), 212P(2) and 212P(3), 212P(4), and the respective N-type semiconductor channel structures 212N(1), 212N(2) and 212N(3), 212N(4) were originally formed as single semiconductor channel structures, but are isolated by the diffusion break 204.

Gates G(1)-G(14) of a metal material are formed in the cell circuits 202(1), 202(2) and elongated in the direction of the Y-axis extending around at least a portion of the P-type and N-type semiconductor channel structures 212P(1)-212P(4), 212N(1)-212N(4). In this manner, active gates for semiconductor devices such as transistors can be formed in areas of the gates G(1)-G(14) that surround the P-type and N-type semiconductor channel structures 212P(1)-212P(4), 212N(1)-212N(4) to form semiconductor channels. An interlayer dielectric (ILD) 213 is disposed above the gates G(1)-G(14) and the P-type and N-type semiconductor channel structures 212P(1)-212P(4), 212N(1)-212N(4) to provide further electrical isolation. In this example, the diffusion break 204 in the circuit 200 is a double diffusion break (DDB) 214 that occupies the space of where two gates G(8), G(9) were located and the area in between. The DDB 214 is formed by a dielectric material 216, such as an oxide material, disposed in an etched isolation area between the gates G(8), G(9) to form the DDB 214. If the dielectric material 216 expands during the fabrication of the circuit 200, the dielectric material 216 will apply a compressive stress $S_C$ to the substrate 210 that will be induced as a compressive strain in the P-type semiconductor channel structures 212P(1)-212P(4) and N-type semiconductor channel structures 210N(1)-210N(4). Compressive strain may improve carrier mobility in the N-type semiconductor channel structures 212N(1)-212N(4), but reduce carrier mobility in the P-type semiconductor channel structures 212P(1)-212P(4). However, if the dielectric material 216 shrinks during the fabrication of the circuit 200, the dielectric material 216 will apply a tensile stress $S_T$ to the substrate 210 that will be induced as a tensile strain in the P-type semiconductor channel structures 212P(1)-212P(4) and N-type semiconductor channel structures 212N(1)-212N(4). Tensile strain may improve carrier mobility in the P-type semiconductor channel structures 212P(1)-212P(4), but reduce carrier mobility in the N-type semiconductor channel structures 212N(1)-212N(4).

Thus, either the P-type semiconductor channel structures 212NP(1)-212P(4) or N-type semiconductor channel structures 212N(1)-212N(4) may have a reduced carrier mobility as a result of the DDB 214. A single diffusion break (SDB) could alternatively be formed in the circuit 200 that would occupy a single gate G space. A SDB can be formed in a later processing stage of the circuit 200 with lower temperatures which may reduce expansion or shrinkage of the dielectric material 216 in the SDB, and thus reduce stress imparted in the P-type semiconductor channel structures 212P(1)-212P (4) and N-type semiconductor channel structures 212N(1)-212N(4). However, the reduced stress will not enhance the carrier mobility of either P-type semiconductor channel structures 212P(1)-212P(4) and N-type semiconductor channel structures 212N(1)-212N(4) like the DDB 214.

SUMMARY OF THE DISCLOSURE

Aspects disclosed herein include circuits employing a double diffusion break (DDB) and a single diffusion break (SDB) in different type semiconductor diffusion regions ("diffusion regions"). The choice of including either a DDB or SDB or the opposite of a SDB and DDB in different type diffusion regions can be chosen based on increasing carrier mobility in a semiconductor channel of a semiconductor device formed in one type of diffusion region, while reducing or avoiding the degradation of carrier mobility in a semiconductor channel formed in the other type of diffusion region. Related fabrication methods are also disclosed. In this regard, in exemplary aspects disclosed herein, an integrated circuit ("circuit") is provided that includes a P-type diffusion region(s) and an N-type diffusion region(s) formed in a substrate. P-type semiconductor devices can be formed in the P-type diffusion region(s), and N-type semiconductor devices can be formed in the N-type diffusion region(s). Thus, for example, complementary metal oxide semiconductor (CMOS) circuits can be realized from the formed P-type semiconductor devices and N-type semiconductor devices. In exemplary aspects disclosed herein, either a DDB or a SDB is formed in the N-type diffusion region(s), and the opposing type diffusion, either a SDB or DDB, is formed in the P-type diffusion region(s). Forming different diffusion breaks between a DDB and a SDB in different diffusion regions of the circuit can be employed to induce channel strain that will increase carrier mobility of either P- or N-type semiconductor devices formed in respective P- or N-type diffusion region(s), while avoiding or reducing such induced channel strain in either P- or N-type semiconductor devices formed in respective P- or N-type diffusion region(s) that may degrade carrier mobility.

In one exemplary aspect, the DDB is formed by a trench isolation structure formed in a substrate between two dummy gates in the first diffusion region and not in the second diffusion region. The dummy gates extend longitudinally between the first and second diffusion regions. In this manner, the trench isolation structure and the dummy gates form the DDB in the first diffusion region, and the same dummy gates forms the SDB in the second diffusion region.

In one exemplary aspect, if a DDB will induce a tensile strain in the diffusion regions of the circuit, a DDB is formed in the N-type diffusion region(s) of the circuit, and a SDB is formed in the P-type diffusion region(s) of the circuit. Inducing tensile strain in the N-type diffusion region(s) can increase carrier mobility of a semiconductor channel of an N-type semiconductor device(s) formed in the N-type diffusion region(s), but reduce carrier mobility in a semiconductor channel of a P-type semiconductor device(s). Thus, in this aspect, a SDB is formed in the P-type diffusion region(s) to avoid inducing or reducing tensile stress to the P-type diffusion region(s) so as to not reduce carrier mobility of a P-type semiconductor device(s) formed in the P-type diffusion region(s) that may result from a DDB.

In another exemplary aspect, if a DDB will induce a compression strain in the diffusion regions of the circuit, a DDB is formed in the P-type diffusion region(s) of the circuit, and a SDB is formed in the N-type diffusion region(s) of the circuit. Inducing compressive strain in the P-type diffusion region(s) can increase carrier mobility of a semiconductor channel of a P-type semiconductor device(s) formed in the P-type diffusion region(s), but reduce carrier mobility in a semiconductor channel of an N-type semiconductor device(s). Thus, in this aspect, a SDB is formed in the N-type diffusion region(s) to avoid inducing or reducing compressive stress to the N-type diffusion region(s) so as to not reduce carrier mobility of an N-type device(s) formed in the N-type diffusion region(s) that may result from a DDB.

In this regard, in one exemplary aspect, a circuit is provided and comprises a substrate comprising a top surface. The circuit also comprises a first diffusion region comprising either an N-type diffusion region or a P-type diffusion region disposed in the substrate. The first diffusion region comprises at least one first semiconductor channel each having a first longitudinal axis in a first direction. The circuit also comprises a second diffusion region comprising either a P-type diffusion region or an N-type diffusion region opposite of the diffusion type of the first diffusion region. The second diffusion region is disposed in the substrate and comprises at least one second semiconductor channel each having a second longitudinal axis parallel to the first longitudinal axis. The circuit also comprises a first dummy gate extending along a third longitudinal axis orthogonal to the first longitudinal axis, the first dummy gate disposed above the first diffusion region and the second diffusion region. The circuit also comprises a second dummy gate extending along a fourth longitudinal axis parallel to the third longitudinal axis, the second dummy gate disposed above the first diffusion region and the second diffusion region, the second dummy gate adjacent to the first dummy gate by a gate pitch. The circuit also comprises a DDB in the first diffusion region. The DDB comprises a trench isolation structure between the first dummy gate and the second dummy gate in the first direction, a portion of the first dummy gate in the first diffusion region, and a portion of the second dummy gate in the first diffusion region. The circuit also comprises a SDB in the second diffusion region. The SDB comprises a portion of the first dummy gate in the second diffusion region, and a portion of the second dummy gate in the second diffusion region.

In another exemplary aspect, a circuit is provided and comprises a substrate comprising a top surface. The circuit also comprises a means for providing a first diffusion in the substrate, the means for providing the first diffusion comprising either a means for providing a P-type diffusion in the substrate or a means for providing an N-type diffusion in the substrate. The means for providing the first diffusion comprises at least one first means for providing a semiconducting channel. The circuit also comprises a means for providing a second diffusion in the substrate, the means for providing the second diffusion comprising either a means for providing a P-type diffusion in the substrate or a means for providing an N-type diffusion in the substrate. The means for providing the second diffusion comprises at least one second means for providing a semiconducting channel. The circuit also comprises a means for controlling conduction in at least one of the at least one first means for providing a semiconducting channel, and the at least one second means for providing a semiconducting channel. The circuit also comprises a first means for providing isolation adjacent to an active gate by a gate pitch. The circuit also comprises a second means for providing isolation adjacent to the first means for providing isolation by the gate pitch. The circuit also comprises a means for providing a DDB in the first diffusion region comprising a means for providing trench isolation between the first means for providing isolation and the second means for providing isolation, a portion of the first means for providing isolation in the means for providing the first diffusion, and a portion of the second means for providing isolation in the means for providing the first diffusion. The circuit also comprises a means for providing a SDB in the second diffusion region comprising a portion of the first means for providing isolation in first means for providing the second diffusion, and a portion of the second means for providing isolation in first means for providing the second diffusion.

In another exemplary aspect, a method of fabricating a circuit is provided. The method comprises forming a substrate, the substrate comprising a top surface. The method also comprises forming a first diffusion region having a first longitudinal axis in a first direction in the substrate, the first diffusion region comprising either an N-type diffusion region or a P-type diffusion region in the substrate. The method also comprises forming a second diffusion region separated by a non-diffusion region from the first diffusion region and having a second longitudinal axis parallel to the first longitudinal axis, the second diffusion region comprising either a P-type diffusion region or an N-type diffusion region in the substrate. The method also comprises forming a trench isolation structure in the substrate in the first diffusion region, the trench isolation structure extending from the top surface of the substrate to a depth in the substrate. The method also comprises forming a plurality of dummy gates each extending along longitudinal axes parallel to each other and orthogonal to the first longitudinal axis above the first diffusion region and the second diffusion region, the plurality of dummy gates each spaced apart from each other by a gate pitch. The method also comprises replacing at least one of the plurality of dummy gates with at least one active gate. The method also comprises forming an opening above two adjacent, dummy gates among the plurality of dummy gates disposed over at least a portion of the trench isolation structure. The method also comprises removing the adjacent dummy gates below the opening to form a plurality of cavities. The method also comprises disposing a dielectric material in the plurality of cavities to form a diffusion break in the first diffusion region and the second diffusion region, the diffusion break in the first diffusion region and the trench isolation structure forming a DDB in the first diffusion region, and the diffusion break in second diffusion region forming a SDB.

BRIEF DESCRIPTION OF THE FIGURES

FIGS. 2A and 2B are respective top and cross-sectional side views of P-type and N-type diffusion regions of a circuit isolated by a double diffusion break (DDB) that induces strain in areas adjacent to the P-type and N-type diffusion regions;

FIGS. 3B and 3C are cross-sectional views taken in respective, different cross-sections of P-type diffusion and N-type diffusion regions in the circuit in FIG. 3A to further illustrate the DDB in the N-type diffusion region and SDB in the P-type diffusion region;

FIGS. 5A-1 is a top view of an exemplary fabrication stage of forming a substrate and forming a patterned shall trench isolation (STI) to provide a DDB in the N-type diffusion region and to create a non-diffusion region between the N-type diffusion region and the P-type diffusion region, in the fabrication of the circuit in FIGS. 3A-3C;

FIGS. 5A-2 and 5A-3 are cross-sectional views taken in respective, different cross-sections of the substrate in the fabrication stage of FIG. 5A-1;

FIG. 5B-1 is a top view of another exemplary fabrication stage of forming dummy gates and spacers adjacent to the dummy gates that extend in the N-type diffusion region and the P-type diffusion regions, forming the source and drain regions, and replacing the dummy gates with metal gates to form N-type and P-type semiconductor devices, in the fabrication of the circuit in FIGS. 3A-3C;

FIGS. 5B-2 and 5B-3 are cross-sectional views taken in respective, different cross-sections of the P-type and N-type diffusion regions in the fabrication stage in FIG. 5B-1;

FIGS. 5C-1 and 5C-2 are cross-sectional views taken in respective, different cross-sections of the P-type diffusion and N-type diffusion regions in the fabrication stage of FIG. 5B-1, to illustrate the deposition of an interlayer dielectric (ILD) over the dummy gates and the P-type and N-type diffusion regions formed therein in the fabrication stage in FIG. 5B-1 for isolation and planarizing a top surface of the ILD, in the fabrication of the circuit in FIGS. 3A-3C;

FIG. 5D-1 is a top view of an exemplary fabrication stage of forming a mask over a photoresist layer disposed on the ILD in the fabrication stage in FIG. 5C-1, to expose a diffusion break region in the P-type and N-type diffusion regions, in the fabrication of the circuit in FIGS. 3A-3C;

FIGS. 5D-2 and 5D-3 are cross-sectional views taken in respective, different cross-sections of the P-type and N-type diffusion regions in the fabrication stage in FIG. 5D-1;

FIG. 5E-1 is a top view of an exemplary fabrication stage of exposing the diffusion break region in the fabrication stage in FIG. 5D-1, to form openings where adjacent dummy gates were formed, in the fabrication of the circuit in FIGS. 3A-3C;

FIGS. 5E-2 and 5E-3 are cross-sectional views taken in respective, different cross-sections of the P-type and N-type diffusion regions in the fabrication stage in FIG. 5E-1;

FIG. 5F-1 is a top view of an exemplary fabrication stage of removing the gate material in the gates in the exposed diffusion break region in the fabrication stage in FIG. 5E-1, to form openings where the gates were formed, in the fabrication of the circuit in FIGS. 3A-3C;

FIGS. 5F-2 and 5F-3 are cross-sectional views taken in respective, different cross-sections of the P-type diffusion and N-type diffusion regions in the fabrication stage in FIG. 5F-1;

FIG. 5G-1 is a top view of an exemplary fabrication stage of filling the openings in the gate areas in the exposed diffusion break region in the fabrication stage in FIG. 5F-1, which forms a SDB in the P-type diffusion region and forms additional isolation adjacent to the STI to form the DDB in the N-type diffusion region, in the fabrication of the circuit in FIGS. 3A-3C;

FIGS. 5G-2 and 5G-3 are cross-sectional views taken in respective, different cross-sections of the P-type and N-type diffusion regions in the fabrication stage in FIG. 5G-1;

FIGS. 7B and 7C are cross-sectional views taken in respective, different cross-sections of P-type and N-type diffusion regions in the circuit in FIG. 6A to further illustrate the DDB in the N-type diffusion region and SDB in the P-type diffusion region;

FIG. 9 is a block diagram of an exemplary processor-based system that can include a circuit employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuits in FIGS. 3A-3C, 6A-6C, 7A-7C, and 8A-8C.

DETAILED DESCRIPTION

Figure 1:
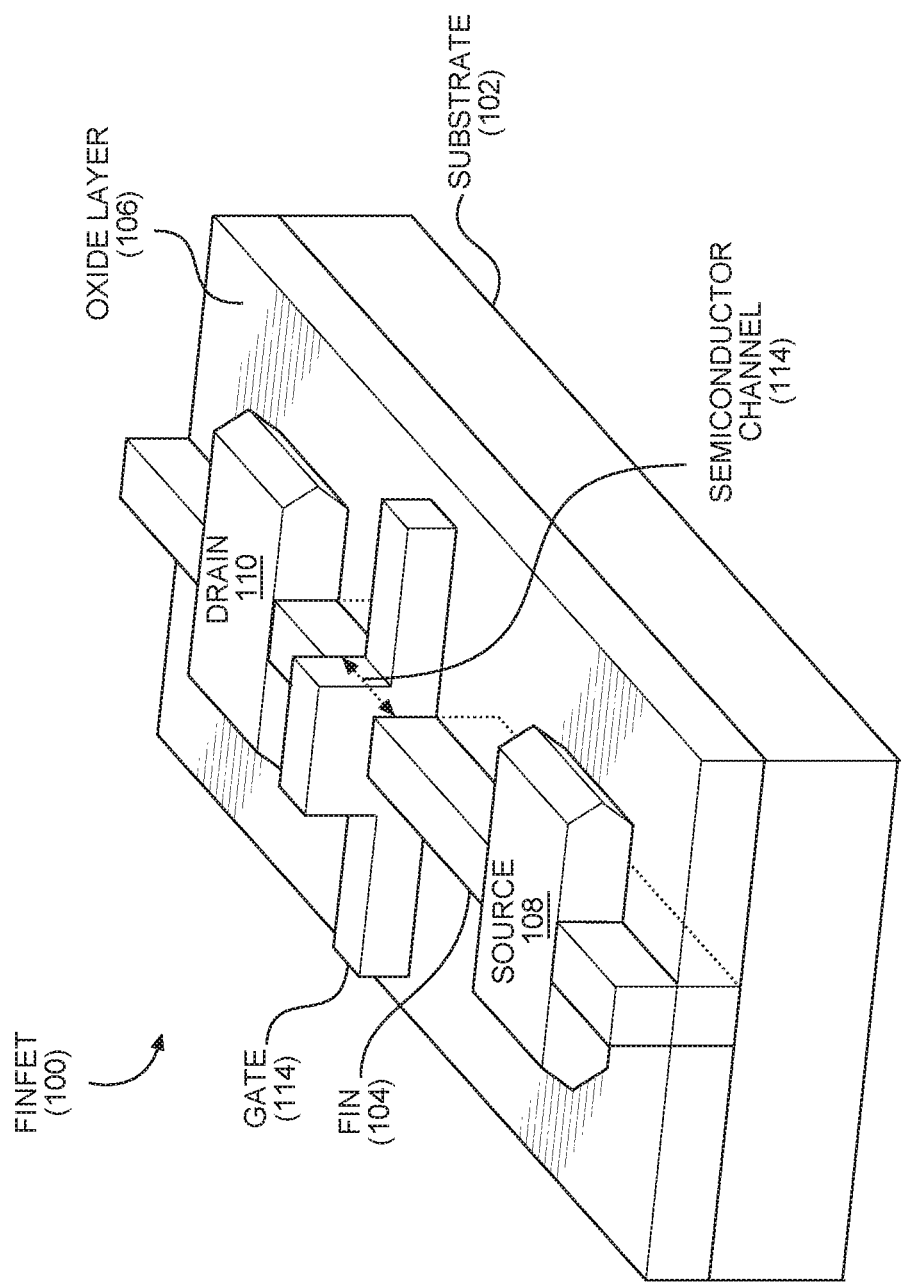
FIG. 1 is a perspective view of an exemplary Fin Field-Effect Transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects Aspects disclosed herein include circuits employing a double diffusion break (DDB) and a single diffusion break (SDB) in different type semiconductor diffusion regions ("diffusion regions"). The choice of including either a DDB or SDB or the opposite of a SDB and DDB in different type diffusion regions can be chosen based on increasing carrier mobility in a semiconductor channel of a semiconductor device formed in one type of diffusion region, while reducing or avoiding the degradation of carrier mobility in a semiconductor channel formed in the other type of diffusion region. Related fabrication methods are also disclosed. In this regard, in exemplary aspects disclosed herein, an integrated circuit ("circuit") is provided that includes a P-type diffusion region(s) and an N-type diffusion region(s) formed in a substrate. P-type semiconductor devices can be formed in the P-type diffusion region(s), and N-type semiconductor devices can be formed in the N-type diffusion region(s). Thus, for example, complementary metal oxide semiconductor (CMOS) circuits can be realized from the formed P-type semiconductor devices and N-type semiconductor devices. In exemplary aspects disclosed herein, either a DDB or a SDB is formed in the N-type diffusion region(s), and the opposing type diffusion, either a SDB or DDB, is formed in the P-type diffusion region(s). Forming different diffusion breaks between a DDB and a SDB in different diffusion regions of the circuit can be employed to induce channel strain that will increase carrier mobility of either P- or N-type semiconductor devices formed in respective P- or N-type diffusion region(s), while avoiding or reducing such induced channel strain in either P- or N-type semiconductor devices formed in respective P- or N-type diffusion region(s) that may degrade carrier mobility.

In one exemplary aspect, the DDB is formed by a trench isolation structure formed in a substrate between two dummy gates in the first diffusion region and not in the second diffusion region. The dummy gates extend longitudinally between the first and second diffusion regions. In this manner, the trench isolation structure and the dummy gates form the DDB in the first diffusion region, and the same dummy gates forms the SDB in the second diffusion region.

In one exemplary aspect, if a DDB will induce a tensile strain in the diffusion regions of the circuit, a DDB is formed in the N-type diffusion region(s) of the circuit, and a SDB is formed in the P-type diffusion region(s) of the circuit. Inducing tensile strain in the N-type diffusion region(s) can increase carrier mobility of a semiconductor channel of an N-type semiconductor device(s) formed in the N-type diffusion region(s), but reduce carrier mobility in a semiconductor channel of a P-type semiconductor device(s). Thus, in this aspect, a SDB is formed in the P-type diffusion region(s) to avoid inducing or reducing tensile stress to the P-type diffusion region(s) so as to not reduce carrier mobility of a P-type semiconductor device(s) formed in the P-type diffusion region(s) that may result from a DDB.

Figure 3A:
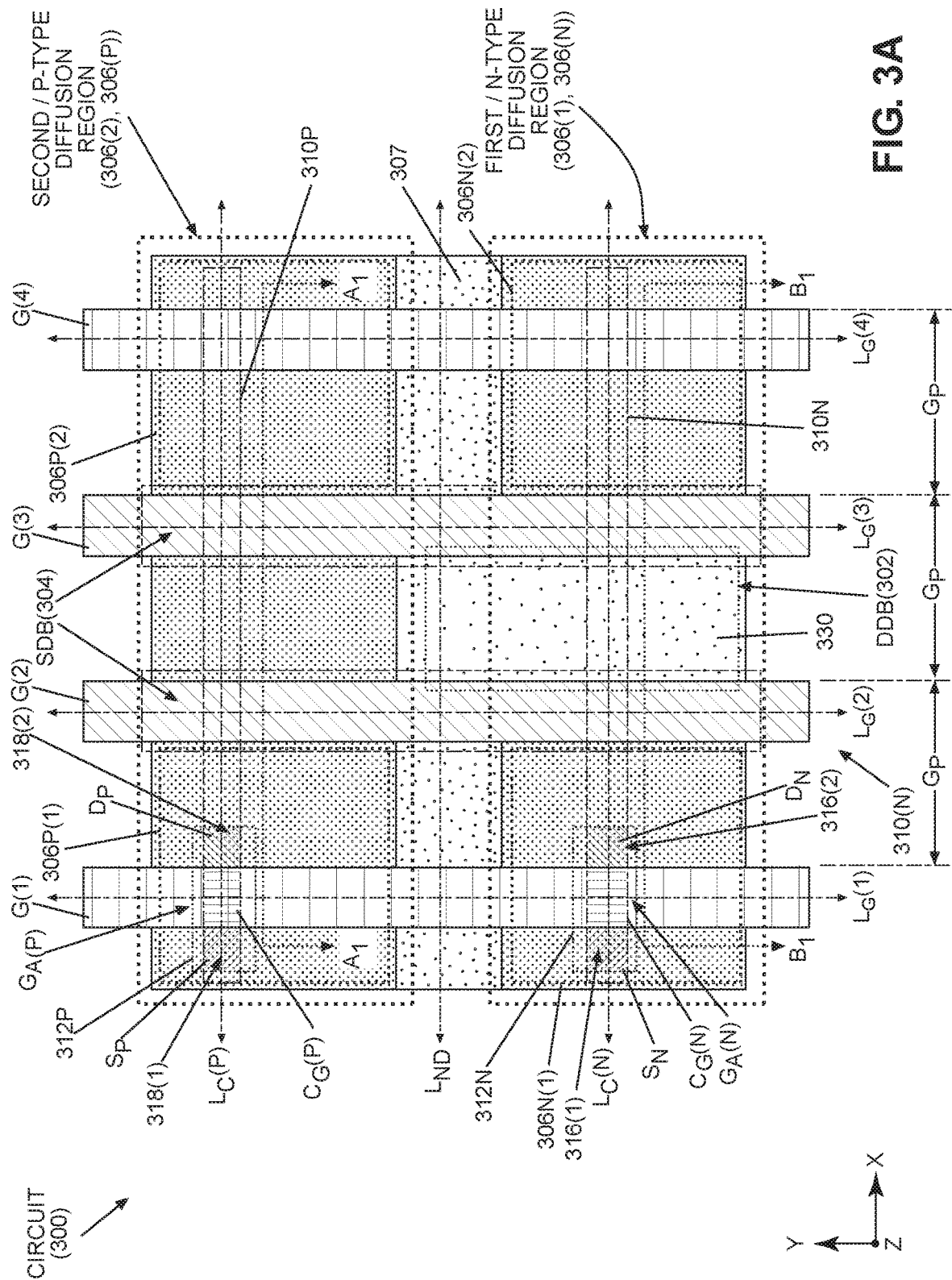
FIG. 3A is a top view of an exemplary circuit employing a DDB and a single diffusion break (SDB) in different types of diffusion regions to increase carrier mobility in a Fin Field-Effect Transistor(s) (FET) (FinFET(s)) formed in one type of diffusion region(s), while reducing or avoiding the degradation of carrier mobility in a FinFET(s)) formed in the other type of diffusion region.

In this regard, FIGS. 3A-3C illustrate an exemplary circuit 300 employing a DDB 302 and a SDB 304 in different types of respective first and second diffusion regions 306(1), 306(2) to increase carrier mobility in a FET(s) formed in the circuit 300. The circuit 300 may be an integrated circuit (IC) that can be fabricated in an IC chip. FIG. 3A is a top view of the circuit 300. FIGS. 3B and 3C are cross-sectional views taken in respective cross-sections $A_1$-$A_1$, $B_1$-$B_1$ of the circuit 300 in FIG. 3A to further illustrate the DDB 302 in the first diffusion region 306(1) and the SDB 304 in the second diffusion region 306(2). In this example, the first diffusion region 306(1) is an N-type diffusion region 306(1) (also labeled "306N"), and the second diffusion region is a P-type diffusion region 306(2) (also labeled "306P"). For example, the N-type diffusion region 306N may be formed by doping a portion a semiconductor substrate 308 (e.g., Silicon (Si)) with a pentavalent impurity material as a donor material that is able to give up free electrons in the substrate 308. Likewise as an example, the P-type diffusion region 306P may be formed by doping a portion of the semiconductor substrate 308 with an impurity material that is able to leave holes in the substrate 308. In this example, the DDB 302 is formed in the N-type diffusion region 306N, and the SDB 304 is formed in the P-type diffusion region 306P. The DDB 302 and SDB 304 are isolation structures that are formed in their respective N-type and P-type diffusion regions 306N, 306P to provide isolation to impede the flow electrons or holes between different semiconductor channels of FETs or other semiconductor devices formed on different sides of the respective DDB 302 and SDB 304 in the X-axis direction. For example, the DDB 302 or SDB 304 may be included in the circuit 300 if a circuit design calls for a different bias voltage to be applied to different semiconductor devices formed the in circuit requiring isolation. Also note that the N-type diffusion region 306N is formed in the circuit 300 according to a circuit cell as one diffusion region, but is separated into two N-type diffusion sub-regions 306N(1), 306N(2) by the DDB 302. Likewise, note that the P-type diffusion region 306P is formed in the circuit 300 according to a circuit cell as one diffusion region, but is separated into two P-type diffusion sub-regions 306P(1), 306N(2) by the SDB 304. Also note that there is a non-diffusion region 307 having a longitudinal axis $L_{ND}$ in the X-axis direction between the P-type diffusion region 306P and the N-type diffusion region 306N in the circuit 300.

As shown in FIG. 3A, N-type and P-type semiconductor channels 310N, 310P in the form of "Fins" are formed in the circuit 300 above the substrate 308 and extended along longitudinal axes $L_{C(N)}$, $L_{C(P)}$ in the X-axis direction. Gates G(1)-G(4) are formed in the circuit 300 along longitudinal axes $L_{G(1)}$-$L_{G(4)}$ in the Y-axis direction, orthogonal to the longitudinal axes $L_{C(N)}$, $L_{C(P)}$ of the N-type and P-type semiconductor channels 310N, 310P in the X-axis direction, and extend above and around at least a portion of the P-type and N-type semiconductor channels 310N, 310P. Gates G(1) and G(4) are active gates of a conductive material, such as metal, (referred to herein as "active gates" G(1) or G(4)), and gates G(2) and G(3) are dummy gates of a dielectric material (referred to herein as "dummy gates" G(2) or G(3)). As shown in FIG. 3A, a three dimensional (3D) N-type FET (NFET) 312N in the form of a FinFET in this example is formed in the N-type diffusion region 306N by forming a source $S_N$ and drain $D_N$ on opposites sides of the active gate G(1) in the N-type diffusion region 306N. Similarly, as shown in FIG. 3A, a 3D P-type FET (PFET) 312P also in the form of a FinFET in this example is formed in the P-type diffusion region 306P by forming a source $S_P$ and drain $D_P$ on opposites sides of the active gate G(1) in the P-type diffusion region 306P.

With continuing reference to FIGS. 3A-3C, the DDB 302 is formed in the N-type diffusion region 306N of the circuit 300, because the DDB 302 induces a tensile strain in the N-type diffusion region 306N during fabrication of the circuit 300. Inducing tensile strain in the N-type diffusion region 306N can increase carrier mobility of the N-type semiconductor channel 310N formed in the N-type diffusion region 306N. Thus for example, the tensile strain induced in the N-type semiconductor channel 310N formed in the N-type diffusion region 306N used to form the semiconductor channel of the NFET 312N can increase the drive strength of the NFET 312N. For example, the tensile strain induced by the DDB 302 in the N-type semiconductor channel 310N in the N-type diffusion region 306N may increase the N-type device drive current between approximately five percent (5%) and twenty percent (20%). However, inducing tensile strain in the P-type diffusion region 306P that induces such tensile strain in the P-type semiconductor channel 310P formed in the P-type diffusion region 306P may degrade carrier mobility in the P-type semiconductor channel 310P. This would, for example, have the effect of reducing drive strength of the PFET 312P employing the P-type semiconductor channel 310P in the circuit 300. This may not be desired. Thus, in this example, as will be discussed in more detail below, the SDB 304 is formed in the P-type diffusion region 306P of the circuit 300, as opposed to expanding the DDB 302 formed in the N-type diffusion region 306N also into the P-type diffusion region 306P. This can avoid inducing and/or reducing tensile stress applied to the P-type diffusion region 306P and the P-type semiconductor channel 310P formed therein so as to lessen or avoid reducing carrier mobility in the P-type semiconductor channel 310P and the PFET 312P.

In this manner, the DDB 302 can be formed in the circuit 300 in FIGS. 3A-3C to purposefully induce tensile strain in the N-type diffusion region 306N and the N-type semiconductor channel 310N formed therein to increase drive strength of NFETs formed in the N-type diffusion region 306N, such as NFET 312N. However, reducing carrier mobility of the P-type semiconductor channel 310P in the P-type diffusion region 306P may be avoided to avoid decreasing the drive strength of PFETs, such as PFET 312P, formed in the P-type diffusion region 306P. Additional aspects of the circuit 300 in FIGS. 3A-3C will now be discussed in more detail below.

With reference to FIGS. 3B and 3C, the N-type and P-type semiconductor channels 310N, 310P are disposed on a top surface 314 of the substrate 308 in this example. The gates G(1)-G(4) are located adjacent to each other and have a gate pitch $P_G$ according to the layout of a circuit cell. For example, gate G(1) is located adjacent to dummy gate G(2). Dummy gate G(2) is disposed between and adjacent to active gate G(1) and dummy gate G(3). In this example, the active gates G(1), G(4) extend around at least a portion of the P-type and N-type semiconductor channel 310N, 310P providing active gates to form 3D FETs, such as FinFETs or Gate-All-Around (GAA) FETs. Note however, that the active gates G(1), G(4) may only extend above the P-type and N-type semiconductor channel 310N, 310P for providing active gates G to form planar FETs. As shown in FIG. 3A, a gate contact C(N) is formed over a portion of the active gate G(1) to form an active gate $G_{A(N)}$ for the NFET 312N. Similarly, a gate contact C(p) is formed over a portion of the active gate G(1) to form an active gate $G_{A(P)}$ for the PFET 312P. The source $S_N$ and a drain $D_N$ of the NFET 312N are formed in first and second end portions 316(1), 316(2) in the N-type semiconductor channel 310N on opposite sides of the active gate G(1) where the gate contact $C_{G(N)}$ is formed over the active gate G(1). The source $S_P$ and a drain $D_P$ of the PFET 312P are formed in first and second end portions 318(1), 318(2) in the P-type semiconductor channel 310P on opposite sides of the active gate G(1) where the gate contact $C_{G(P)}$ is formed over the active gate G(1).

As shown in FIGS. 3B and 3C, an interlayer dielectric (ILD) 320 of a dielectric material 322 is disposed above the N-type and P-type semiconductor channel 310N, 310P and the gates G(1)-G(4) provide electrical isolation between these structures and adjacently form conductive structures and/or interconnect layers formed in metal layers in the circuit 300. As shown in FIG. 3B, the SDB 304 in the P-type diffusion region 306P is formed by portions 326(1), 326(2) of the dummy gates G(2), G(3) in the P-type diffusion region 306P. The dummy gates G(2), G(3) extend from a top surface 324 of the ILD 320, through the ILD 320 and from the top surface 314 of the substrate 308, below the substrate to depth $D_{DUM}$ into the substrate 308. It is the portions 326(1), 326(2) of the dummy gates G(2), G(3) that extend from the top surface 314 of the substrate 308 below the top surface 314 to the depth $D_{DUM}$ into the substrate 308 that form the SDB 304. The area between the dummy gates G(2), G(3) below the top surface 314 of the substrate 308 is the material of the substrate 308, which is not filled with a further isolation material. Thus, the dummy gates G(2), G(3) provide a single diffusion break or the SDB 304 in the P-type diffusion region 304P.

As shown in FIG. 3C, the DDB 302 in the N-type diffusion region 306N is formed by portions 328(1), 328(2) of the dummy gates G(2), G(3) extending from the top surface 314 of the substrate 308 also to the depth $D_{DUM}$ below the top surface 314 into the substrate 308 into the substrate 308 similar to the SDB 304. However, the DDB 302 also includes a trench isolation structure 330 formed in an area between the portions 328(1), 328(2) below the top surface 314 of the substrate 308 of the same dummy gates G(2), G(3) whose portions 326(1), 326(2) form the SDB 304 in FIG. 3B. The trench isolation structure 330 is an isolation material 332, such as a dielectric material, that is formed or filled into a trench 334 of a depth $D_{TIS}$ formed in the substrate 308 between the dummy gates G(2), G(3) in the N-type diffusion region 306N. For example, the trench isolation structure 330 may be considered a shallow trench isolation (STI) structure. Thus, the trench isolation structure 330 and the dummy gates G(2), G(3) provide a diffusion break that is considered a double diffusion break and forms the DDB 302. Exemplary detail on how the dummy gates G(2), G(3) are formed to provide the SDB 304 is discussed below in regard to an exemplary process to fabricate the circuit 300. Note that as shown in FIG. 3A, the trench isolation structure 330 can be formed along with a trench 334 formed between the P-type diffusion region 306P and N-type diffusion region 306N that is also filled with the isolation material of the trench isolation structure 330 to isolate the P-type diffusion region 306P from the N-type diffusion region 306N and form the non-diffusion region 307.

As will be discussed in more detail below regarding exemplary fabrication processes of the circuit 300, the dummy gates G(2), G(3) that form the DDB 302 and SDB 304 can be formed before or after a removal metal gate (RMG) process formed in the location of gates G(2), G(3). For example, the dummy gates G(2), G(3) may be formed after the metal gates are formed in gates G(1)-G(4). Gates G(2), G(3) can then be removed and filled with a dielectric material to form isolation structures for the DDB 302 and the SDB 304.

The circuit 300 can be fabricated according to a variety of methods and processes. For example, the circuit 300 can be fabricated according to CMOS fabrication methods. In this regard, FIGS. 4A and 4B are a flowchart illustrating an exemplary process 400 of fabricating the circuit 300 in FIGS. 3A-3C employing a DDB in the N-type diffusion region 306N and a SDB in the P-type diffusion region 306P.

FIGS. 5A-1-5G-3 illustrate exemplary fabrication stages of the circuit 300 as it is fabricated according to the exemplary fabrication process 400. In this regard, the exemplary fabrication process 400 in FIGS. 4A and 4B and the exemplary fabrication stages of the circuit 300 in FIGS. 5A-1-5G-3 will be discussed in conjunction with each other below.

Figure 4A:
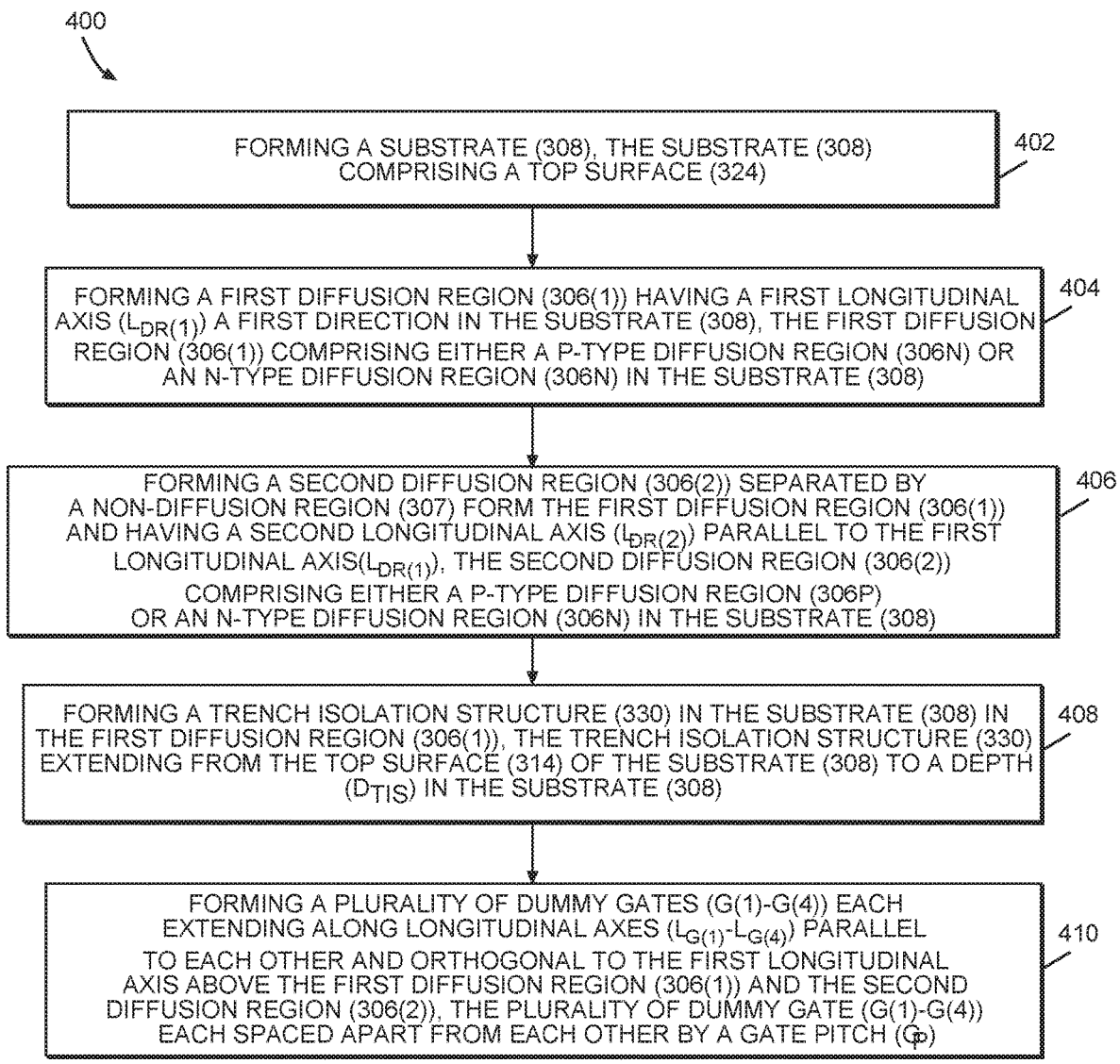
FIGS. 4A and 4B are a flowchart illustrating an exemplary process of fabricating the circuit in FIGS. 3A-3C employing a DDB in the N-type diffusion region and a SDB in the P-type diffusion region.
Figure 4B:
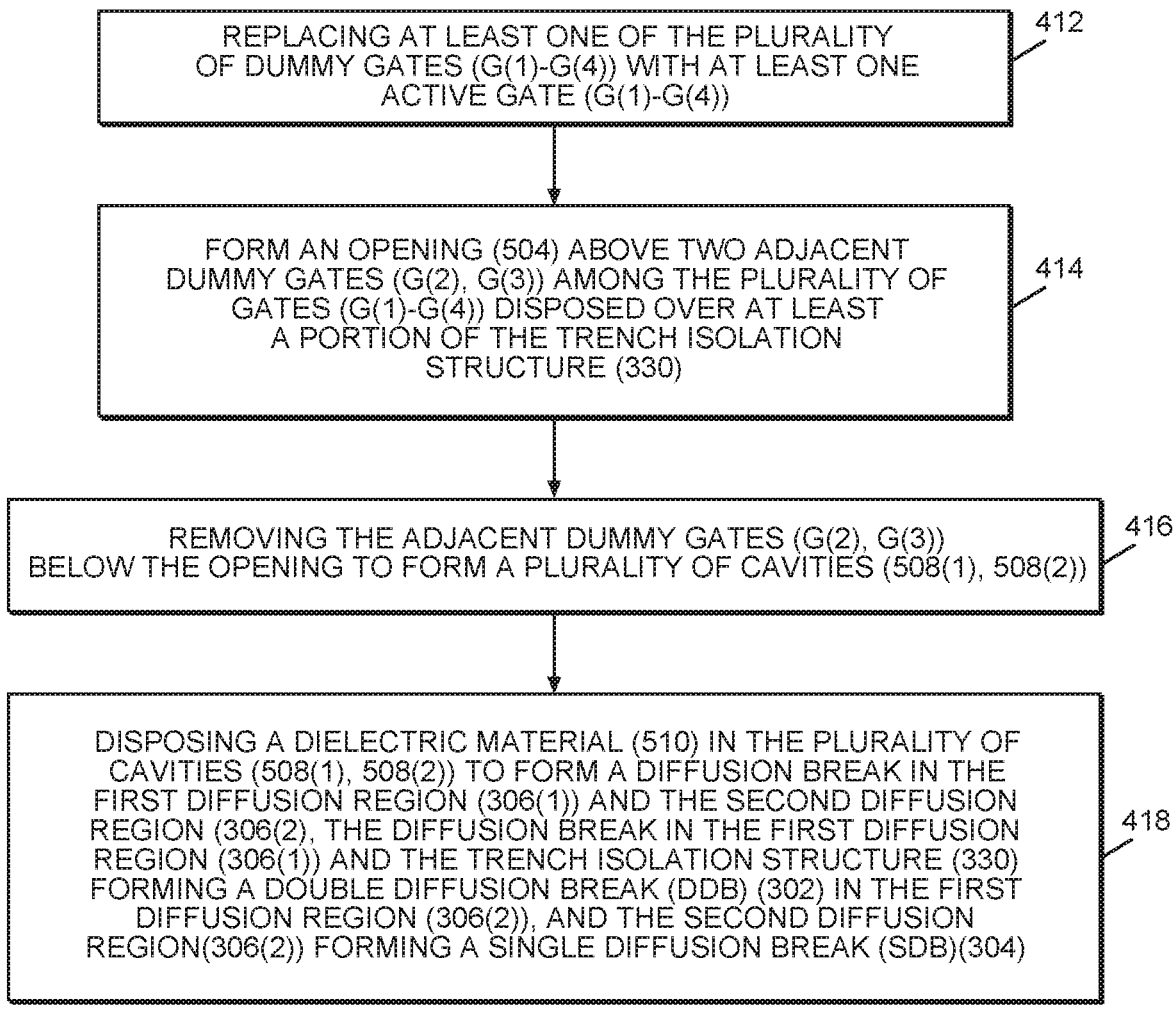
Figures 2, 5B:
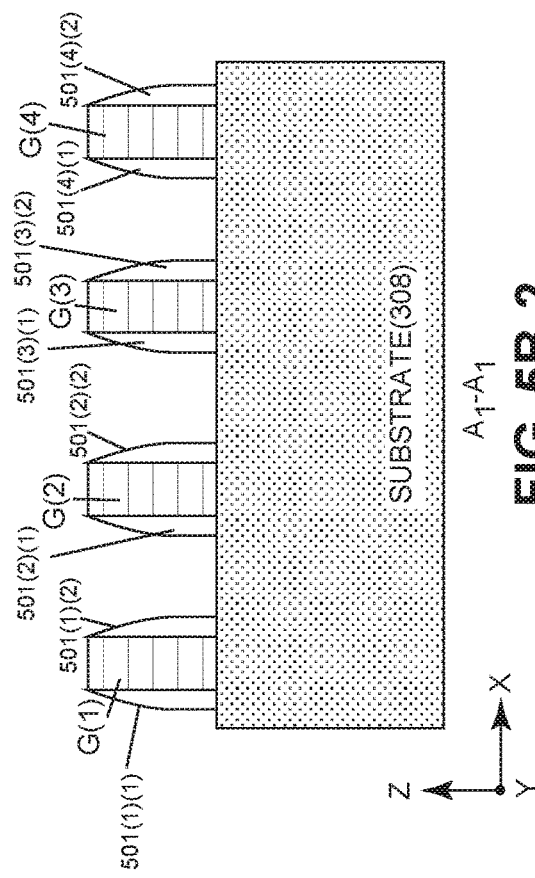
Figures 3, 5B:
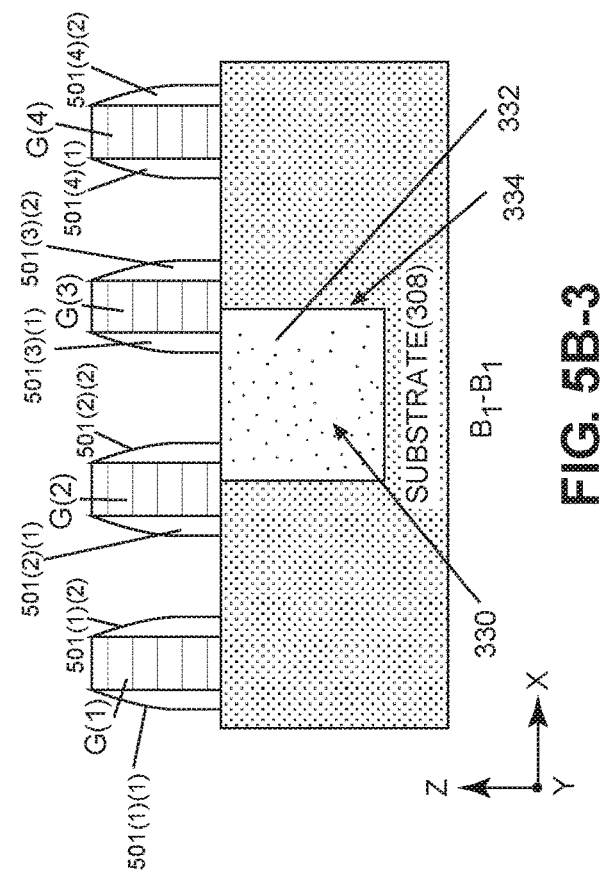
Figures 1, 5B:
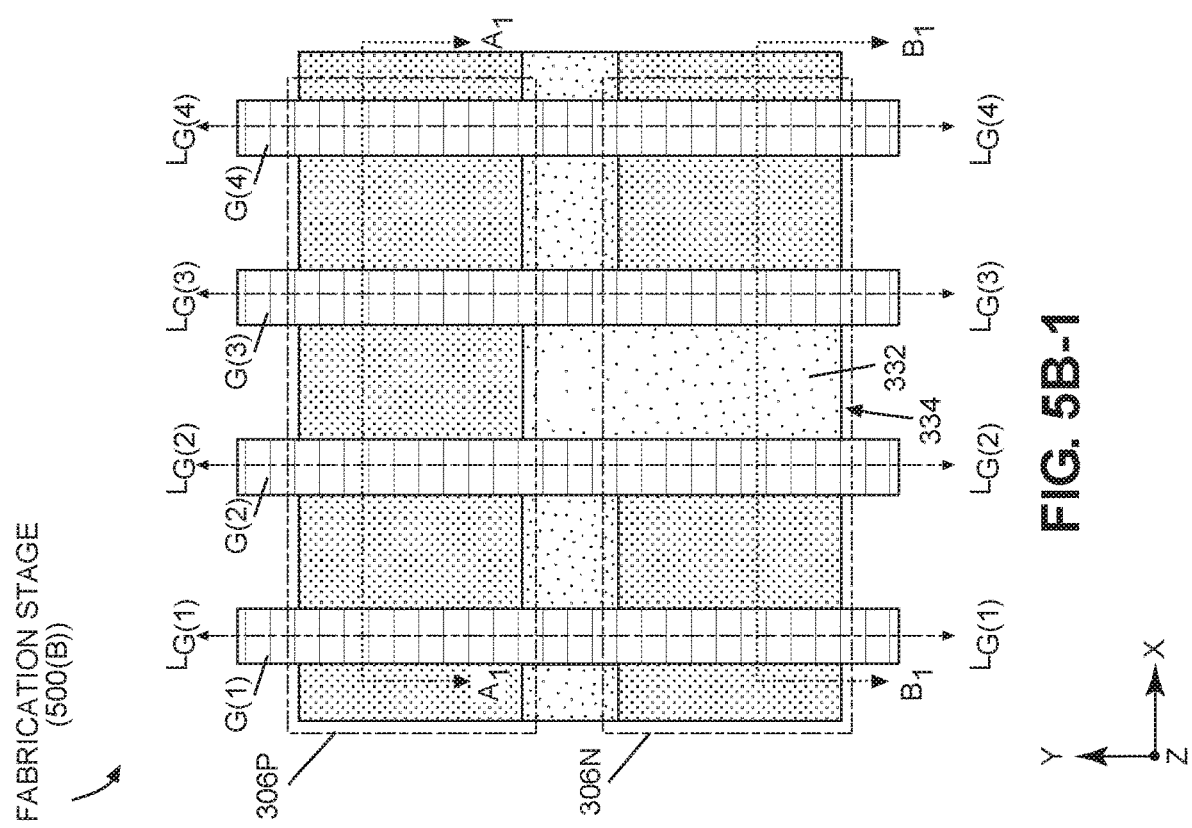
Figures 1, 5G:
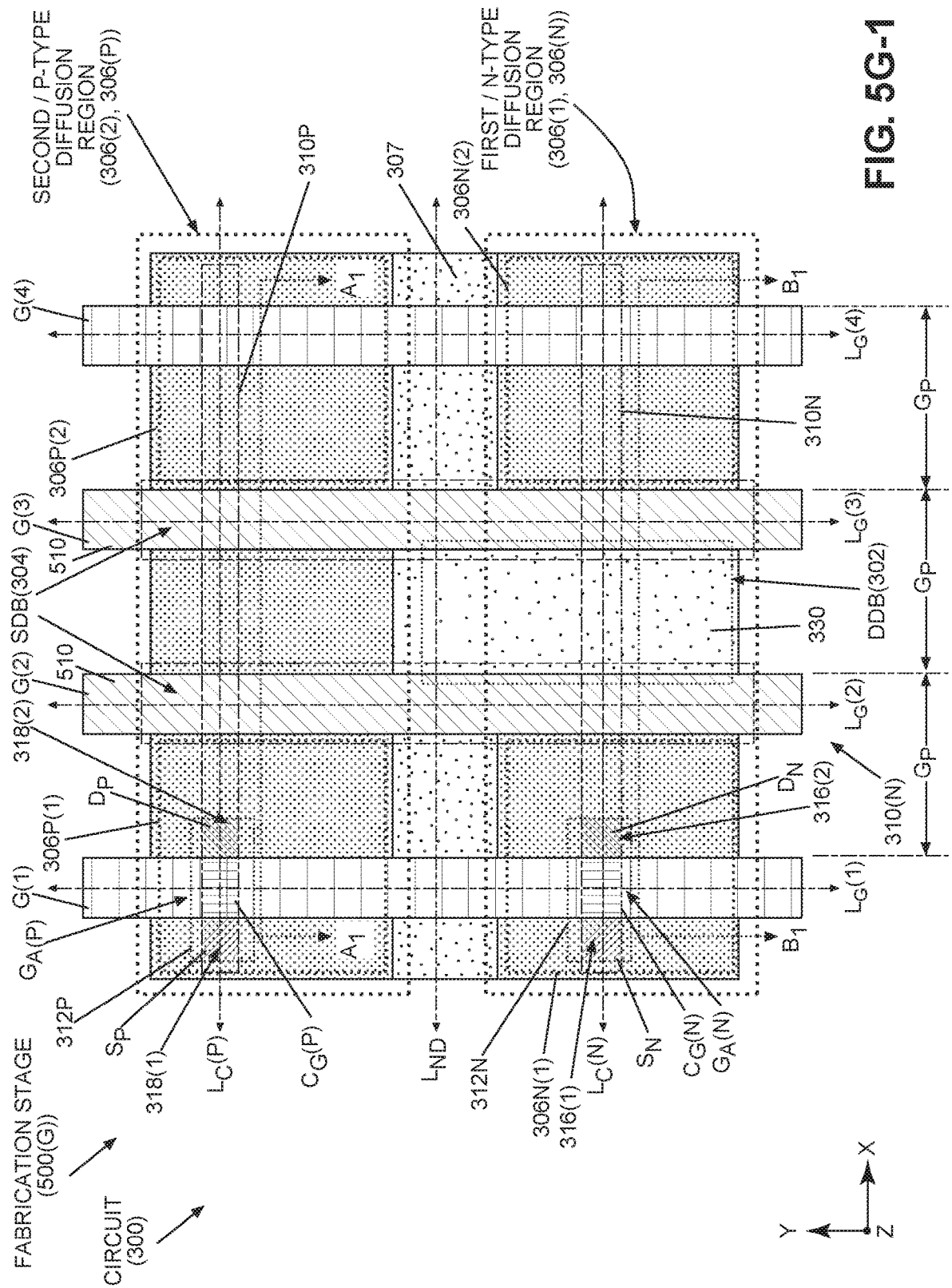

In this regard, with reference to FIG. 4A, a first exemplary step in the process 400 of fabricating the circuit 300 in FIGS. 3A-3C is to form the substrate 308 from a semiconductor material, such as Silicon (Si) for example (block 402 in FIG. 4A). This is shown by example in the fabrication stage 500(A) in FIGS. 5A-1-5A-3. FIG. 5A-1 is a top view of the exemplary fabrication stage 500(A). FIGS. 5A-2 and 5A-3 are cross-sectional views taken in the respective $A_1$-$A_1$ and $B_1$-$B_1$ cross-sections of the substrate 308 in FIG. 5A-1. As shown in FIGS. 5A-1-5A-3, the first diffusion region 306(1) as the N-type diffusion region 306N is formed in the substrate 308, and the second diffusion region 306(2) as the P-type diffusion region 306P is also formed in the substrate 308 (blocks 404 and 406 in FIG. 4A). The N-type and P-type diffusion regions 306N, 306P are separated by the non-diffusion region 307 that is not doped with a P-type or N-type impurity material. The N-type and P-type diffusion regions 306N, 306P have longitudinal axes $L_{DR(N)}$, $L_{DR(P)}$ that are parallel to each other. The trench 334 of depth $D_{TIS}$ formed in the N-type diffusion region 306N and the non-diffusion region 307 as shown in FIGS. 5A-1 and 5A-3 and filled with the isolation material 332, such as an oxide material, to form a trench isolation structure 330 (block 408 in FIG. 4A). In this example, a portion of the trench isolation structure 330 is formed in the N-type diffusion region 306N and a portion is formed in the non-diffusion region 307. As discussed above, the trench isolation structure 330 formed in the N-type diffusion region 306N will form part of the DDB 302 in the N-type diffusion region 306N.

Note that in this example, the trench isolation structure 330 is formed before a replacement metal gate (RMG) process, such that the trench isolation structure 330 may be subject to higher temperatures that may well exceed 400 degrees Celsius for example. This can cause the trench isolation structure 330 to expand and then contract thus causing a tensile stress to occur in the substrate 308 in the N-type diffusion region 306N, which induces a tensile strain in the substrate 308 in the N-type diffusion region 306N. This may be desired to increase carrier mobility of NFETs having semiconductor channels formed from the substrate 308, such as NFET 312N in the circuit 300 in FIGS. 3A-3C.

As an example, the trench 334 to form the trench isolation structure 330 may be etched into the substrate 308 into the pattern that is illustrated in FIG. 5A-1 after transfer using a lithography process of transferring a photoresist layer above the substrate 308, forming a patterned mask above the photoresist layer, and exposing the substrate 308 through openings in the mask to form openings in the photoresist layer for controlling the areas of the trench 334 to be etched. The trench 334 may then be filled with the isolation material 332 to form the trench isolation structure 330. Note that it is not required for the trench 334 to extend into the non-diffusion region 307, but doing such may be efficient from a processing standpoint so that the non-diffusion region 307 and the trench isolation structure 330 in the N-type diffusion region 306N that will form the DDB 302 can be patterned and formed in the same process.

A next exemplary step in the process 400 of fabricating the circuit 300 in FIGS. 3A-3C can be to form a plurality of dummy gates G(1)-G(4) each extending along respective longitudinal axes $L_{G(1)}$-$L_{G(4)}$ parallel to each other and orthogonal to the longitudinal axes $L_{DR(N)}$-$L_{DR(P)}$ of the N-type diffusion region 306N and the P-type diffusion region 306P (block 410 in FIG. 4A). For example, the dummy gates G(1)-G(4) may be formed as Polysilicon gates. Spacers 501(1)(1)-501(4X2) are formed around the respective dummy gates G(1)-G(4) to facilitate dummy gate removal (e.g., by lithography and etching process) and replacement with a metal material as a part of a RMG process. One or more of the dummy gates G(1)-G(4) can be replaced by an active gate, which in this example are gates G(1) and G(4) (block 412 in FIG. 4B). In this example, the gates G(2) and G(3) are left dummy gates. This is shown by example in the fabrication stage 500(B) in FIGS. 5B-1-5B-3. FIG. 5B-1 is a top view of the exemplary fabrication stage 500(B). FIGS. 5B-2 and 5B-3 are cross-sectional views taken in the respective $A_1$-$A_1$ and $B_1$-$B_1$ cross-sections of the fabrication stage 500(B) in FIG. 5B-1. The description of the active gates G(1), G(4) and dummy gates G(2), G(3) have been previously described for the circuit 300 in FIGS. 3A and 3B, and thus are not re-described here.

A next exemplary step in the process 400 of fabricating the circuit 300 in FIGS. 3A-3C can be to deposit the ILD 320 above the gates G(1)-G(4) and the N-type and P-type diffusion regions 306N, 306P to provide isolation as previously discussed for the circuit 300 in FIGS. 3A-3C. A top surface 502 of the ILD 320 can be planarized, such as through a chemical mechanical planarization (CMP) process. This is shown by example in the fabrication stage 500(C) in FIGS. 5C-1 and 5C-2. FIGS. 5C-1 and 5C-2 are cross-sectional views taken in the respective $A_1$-$A_1$ and $B_1$-$B_1$ cross-sections of the fabrication stage 500(B) in FIG. 5B-1.

A next exemplary step in the process 400 of fabricating the circuit 300 in FIGS. 3A-3C can be to forming an opening 504 above two adjacent gates G(2), G(3) that are disposed over the trench isolation structure 330 to prepare these gates G(2), G(3) to be dummy gates and to form part of the DDB 302 in the N-type diffusion region 306N and the SDB 304 in the P-type diffusion region 306P (block 414 in FIG. 4B). This is shown by example in the fabrication stage 500(D) in FIGS. 5D-1-5D-3. FIG. 5D-1 is a top view of an exemplary fabrication stage 500(D) of forming a mask 506 over a photoresist layer disposed on the ILD 320 in the fabrication stage 500(C) in FIG. 5C-1, to expose a diffusion break region in the N-type diffusion and P-type diffusion regions 306P, 306N. FIGS. 5D-2 and 5D-3 are cross-sectional views taken in respective $A_1$-$A_1$ and $B_1$-$B_1$ cross-sections of the substrate 308 in FIG. 5D-1.

A next exemplary step in the process 400 of fabricating the circuit 300 in FIGS. 3A-3C can be to remove the two adjacent gates G(2), G(3) through access through the opening 504 in the fabrication stage 500(D) in FIGS. 5D-1-5D-3 to form cavities 508(1), 508(2) where the material of the gates G(2), G(3) was previously formed. This is to prepare for formation of dummy gates G(2), G(3) included in the DDB 302 and SDB 304 in the circuit 300 in FIGS. 3A-3C (block 416 in FIG. 4B). This is shown by example in the fabrication stage 500(E) in FIGS. 5E-1-5E-3. FIG. 5E-1 is a top view of the exemplary fabrication stage 500(E) of removing (e.g., etching) the metal material of the gates G(2), G(3). FIGS. 5E-2 and 5E-3 are cross-sectional views taken in respective $A_1$-$A_1$ and $B_1$-$B_1$ cross-sections of the substrate 308 in FIG. 5E-1. For example, a dry/wet etch process may be used to remove the material formed in the gates G(2), G(3) in the fabrication stage 500(D) in FIGS. 5D-1-5D-3.

A next exemplary step in the process 400 of fabricating the circuit 300 in FIGS. 3A-3C can be to further etch the cavities 508(1), 508(2) previously formed in the fabrication stage 500(E) in FIGS. 5E-1-5E-2 to form portions of the DDB 302 in the N-type diffusion region 306N, and the SDB 304 in the P-type diffusion region 306P. This is shown in by example in the fabrication stage 500(F) in FIGS. 5F-1-5F-3. FIG. 5F-1 is a top view of the exemplary fabrication stage 500(F) of removing the gate material in the gates G(2), G(3) in the cavities 508(1), 508(2). FIGS. 5F-2 and 5F-3 are cross-sectional views taken in respective $A_1$-$A_1$ and $B_1$-$B_1$ cross-sections of the substrate 308 in FIG. 5F-1. The cavities 508(1), 508(2) are etched to extend from the top surface 324 of the ILD 320, through the ILD 320 and from the top surface 314 of the substrate 308, below the substrate to depth $D_{DUM}$ into the substrate 308. It is portions 326(1), 326(2) of the dummy gates G(2), G(3) that extend from the top surface 314 of the substrate 308 below the top surface 314 to a depth $D_{DUM}$ into the substrate 308 that form the SDB 304. As shown in the exemplary fabrication stage 500(G) in FIGS. 5G-1-5G-3, a dielectric material 510 is then filled in the cavities 508(1), 508(2) to form the dummy gates G(2), G(3) (block 418 in FIG. 4B). As previously discussed with regard to the circuit 300 in FIGS. 3A-3C, the dummy gates G(2), G(3) provide the DDB 302 for the N-type diffusion region 306N and the SDB 304 in the P-type diffusion region 304P.

Figure 6A:
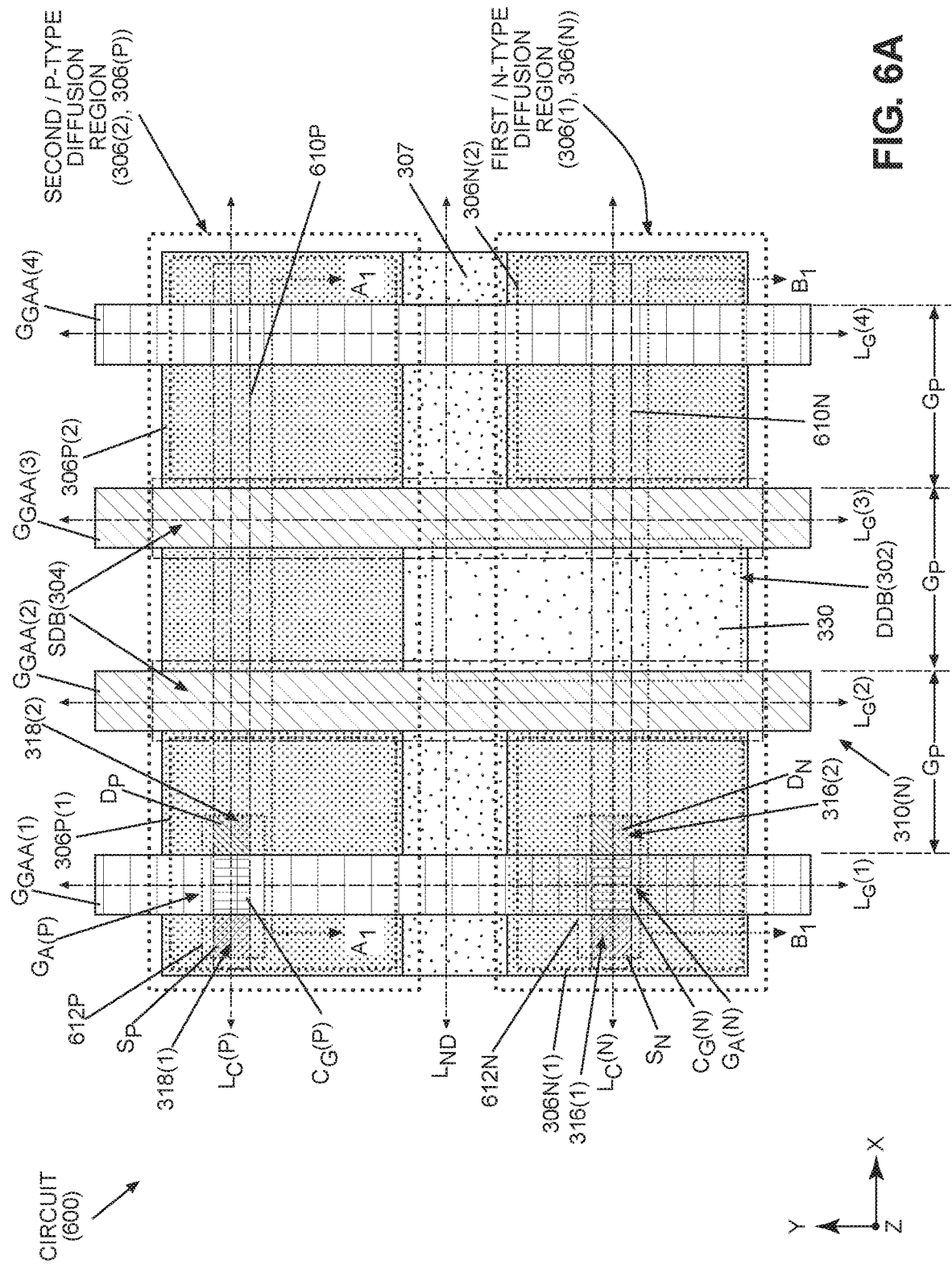
FIG. 6A is a top view of another exemplary circuit employing a DDB and a SDB in different types of diffusion regions to increase carrier mobility in a gate-all-around (GAA) FET(s) formed in one type of diffusion region(s), while reducing or avoiding the degradation of carrier mobility in a GAA FET(s) formed in the other type of diffusion region.
Figure 6B:
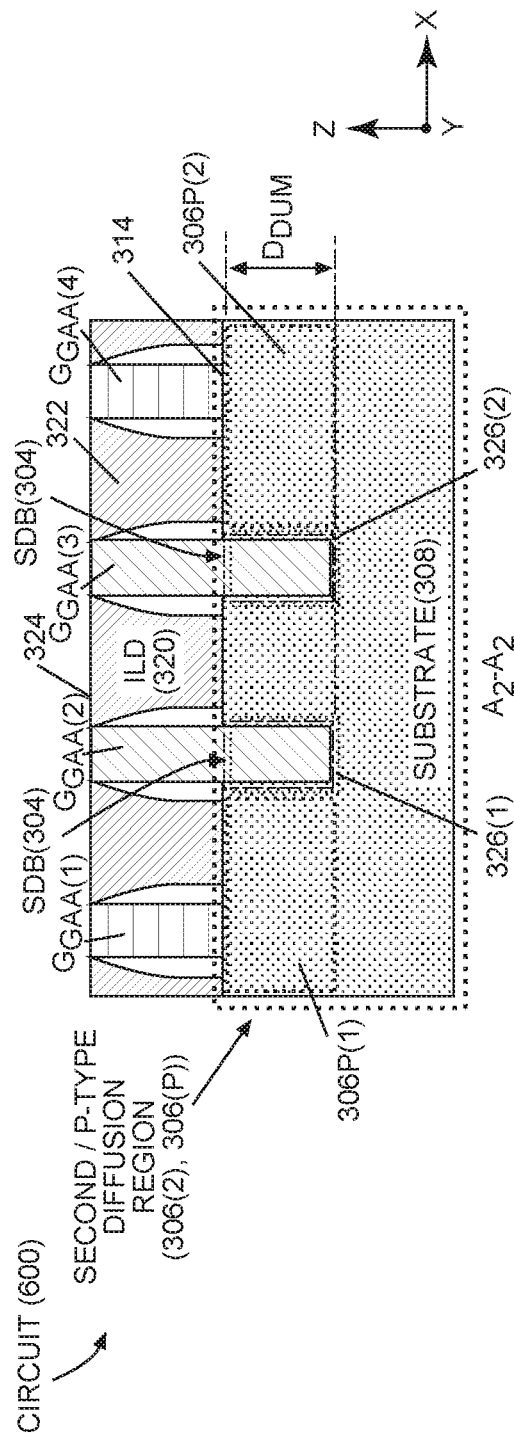
FIGS. 6B and 6C are cross-sectional views taken in respective, different cross-sections of P-type and N-type diffusion regions in the circuit in FIG. 6A to further illustrate the DDB in the N-type diffusion region and SDB in the P-type diffusion region.
Figure 6C:
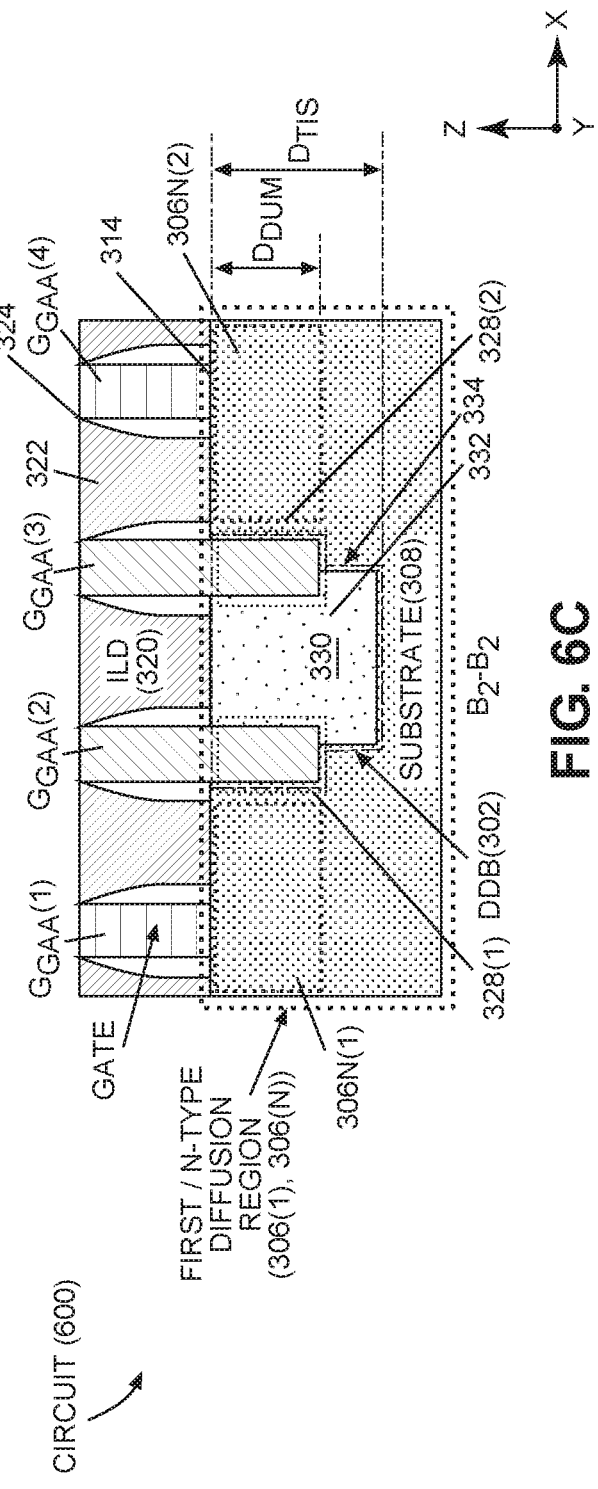

Other types of FETs other than FinFETs can be formed in the circuit 300 in FIGS. 3A-3C. For example, FIGS. 6A-6C illustrate an exemplary circuit 600 that includes GAA NFETs 612N and GAA PFETs 612P and that employs the DDB 302 and the SDB 304 in respective, different types of first and second diffusion regions 306(1), 306(2) to increase carrier mobility in a FET(s) formed in a circuit 600. In this regard, FIG. 6A is a top view of the circuit 600. FIGS. 6B and 6C are cross-sectional views taken in respective cross-sections $A_2$-$A_2$, $B_2$-$B_2$ of the circuit 600 in FIG. 6A to further illustrate the DDB 302 in the first diffusion region 306(1) and the SDB 304 in the second diffusion region 306(2). Common elements and components between the circuit 300 in FIGS. 3A-3C and the circuit 600 in FIGS. 6A-6C are illustrated with common element labeling and numbers and thus will not be re-described.

As shown in FIG. 6A, N-type and P-type semiconductor channels 610N, 610P in the form of nano structures (e.g., nanowires, nanoslabs, nanotubes) are formed in the circuit 600 above the substrate 308 and extended along longitudinal axes $L_{C(N)}$, $L_{C(P)}$ in the X-axis direction. Gates $G_{GAA(1)}$-$G_{GAA(4)}$ are formed in the circuit 600 along respective longitudinal axes $L_{G(1)}$-$L_{G(4)}$ in the Y-axis direction, orthogonal to the longitudinal axes $L_{C(N)}$, $L_{C(P)}$ of the N-type and P-type semiconductor channels 610N, 610P in the X-axis direction. The gates $G_{GAA(1)}$-$G_{GAA(4)}$ extend above and around at least a portion of the P-type and N-type semiconductor channels 610N, 610P. In one example the gates $G_{GAA(1)}$-$G_{GAA(4)}$ extend all the way around the P-type and N-type semiconductor channels 610N, 610P. Gates $G_{GAA(1)}$ and $G_{GAA(4)}$ in the circuit 600 are active gates of a conductive material, such as metal, (referred to herein as "active gates" $G_{GAA(1)}$ or $G_{GAA(4)}$). Gates $G_{GAA(2)}$ and $G_{GAA(3)}$ in the circuit 600 are dummy gates of a dielectric material (referred to herein as "dummy gates" $G_{GAA(2)}$ or $G_{GAA(3)}$). As shown in FIG. 6A, a 3D NFET 612N in the form of a GAA NFET in this example is formed in the N-type diffusion region 306N by forming a source $S_N$ and drain $D_N$ on opposites sides of the active gate $G_{GAA(1)}$ in the N-type diffusion region 306N. Similarly, as shown in FIG. 6A, a 3D P-type PFET 612P the form of a GAA PFET in this example is formed in the P-type diffusion region 306P by forming a source $S_P$ and drain $D_P$ on opposites sides of the active gate $G_{GAA(1)}$ in the P-type diffusion region 306P.

With continuing reference to FIGS. 6A-6C, like circuit 300 in FIGS. 3A-3C, the DDB 302 is formed in the N-type diffusion region 306N of the circuit 600, because the DDB 302 induces a tensile strain in the N-type diffusion region 306N during fabrication of the circuit 600. Inducing tensile strain in the N-type diffusion region 306N can increase carrier mobility of the N-type semiconductor channel 610N formed in the N-type diffusion region 306N. Thus for example, the tensile strain induced in the N-type semiconductor channel 610N formed in the N-type diffusion region 306N used to form the semiconductor channel of the GAA NFET 612N can increase the drive strength of the GAA NFET 612N. For example, the tensile strain induced by the DDB 302 in the N-type semiconductor channel 610N in the N-type diffusion region 306N may increase the N-type device drive current between approximately five percent (5%) and twenty percent (20%). However, inducing tensile strain in the P-type diffusion region 306P that induces such tensile strain in the P-type semiconductor channel 610P formed in the P-type diffusion region 306P may degrade carrier mobility in the P-type semiconductor channel 610P. This would, for example, have the effect of reducing drive strength of the GAA PFET 612P employing the P-type semiconductor channel 610P in the circuit 600. This may not be desired. Thus, as described with regard to the circuit 300 in FIGS. 3A-3C, the SDB 304 is formed in the P-type diffusion region 306P of the circuit 300, as opposed to expanding the DDB 302 formed in the N-type diffusion region 306N also into the P-type diffusion region 306P. This can avoid inducing and/or reducing tensile stress applied to the P-type diffusion region 306P and the P-type semiconductor channel 610P formed therein so as to lessen or avoid reducing carrier mobility in the P-type semiconductor channel 610P and the GAA PFET 612P.

The exemplary fabrication processes of the circuit 300 in FIG. 4 and FIGS. 5A-1-5G-3 can be employed to form the DDB 302 and SDB 304 in the circuit 600 in FIGS. 6A-6C.

Figure 7A:
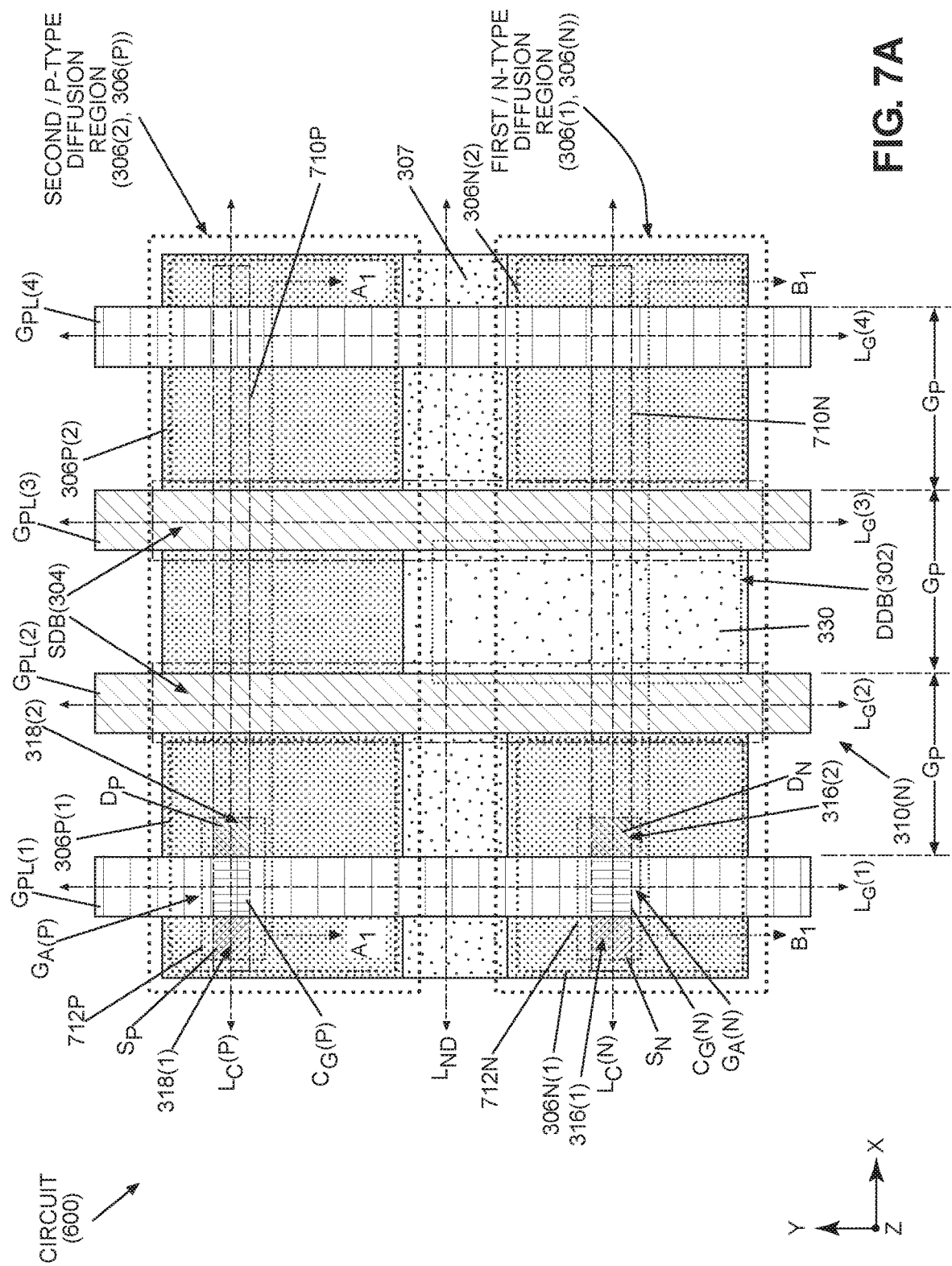
FIG. 7A is a top view of another exemplary circuit employing a DDB and a SDB in different types of diffusion regions to increase carrier mobility in a planar transistor(s) formed in one type of diffusion region(s), while reducing or avoiding the degradation of carrier mobility in a planar transistor(s) formed in the other type of diffusion region.

FIGS. 7A-7C illustrate an exemplary circuit 700 that includes planar NFETs 712N and planar PFETs 712P and that employs the DDB 302 and the SDB 304 in respective, different types of first and second diffusion regions 306(1), 306(2) to increase carrier mobility in a FET(s) formed in a circuit 600. FIG. 7A is a top view of the circuit 600. FIGS. 7B and 7C are cross-sectional views taken in respective, cross-sections $A_3$-$A_3$, $B_3$-$B_3$ of the circuit 700 in FIG. 7A to further illustrate the DDB 302 in the first diffusion region 306(1) and the SDB 304 in the second diffusion region 306(2). Common elements and components between the circuit 300 in FIGS. 3A-3C and the circuit 700 in FIGS. 7A-7C are illustrated with common element labeling and numbers and thus will not be re-described.

As shown in FIG. 7A, N-type and P-type semiconductor channels 710N, 710P in the form of planar channels formed in the circuit 700 in the substrate 308 and extend along longitudinal axes $L_{C(N)}$, $L_{C(P)}$ in the X-axis direction. Gates $G_{PL(1)}$-$G_{PL(4)}$ in the circuit 700 are formed in the circuit 700 along longitudinal axes $L_{G(1)}$-$L_{G(4)}$ in the Y-axis direction, orthogonal to the longitudinal axes $L_{C(N)}$, $L_{C(P)}$ of the N-type and P-type semiconductor channels 710N, 710P in the X-axis direction. The gates $G_{PL(1)}$-$G_{PL(4)}$ extend above the P-type and N-type semiconductor channels 710N, 710P. Gates $G_{PL(1)}$ and $G_{PL(4)}$ in the circuit 700 are active gates of a conductive material, such as metal, (referred to herein as "active gates" $G_{PL(1)}$ or $G_{PL(4)}$). Gates $G_{PL(2)}$ and $G_{PL(3)}$ are dummy gates of a dielectric material (referred to herein as "dummy gates" $G_{PL(2)}$ or $G_{PL(3)}$). As shown in FIG. 7A, a planar NFET 712N in this example is formed in the N-type diffusion region 306N by forming a source $S_N$ and drain $D_N$ on opposites sides of the active gate $G_{PL(1)}$ in the N-type diffusion region 306N. Similarly, as shown in FIG. 7A, a planar PFET 712P in this example is formed in the P-type diffusion region 306P by forming a source $S_P$ and drain $D_P$ on opposites sides of the active gate $G_{PL(1)}$ in the P-type diffusion region 306P.

With continuing reference to FIGS. 7A-7C, like the circuit 300 in FIGS. 3A-3C, the DDB 302 is formed in the N-type diffusion region 306N of the circuit 300, because the DDB 302 induces a tensile strain in the N-type diffusion region 306N during fabrication of the circuit 300. Inducing tensile strain in the N-type diffusion region 306N can increase carrier mobility of the N-type semiconductor channel 710N formed in the N-type diffusion region 306N. Thus for example, the tensile strain induced in the N-type semiconductor channel 710N formed in the N-type diffusion region 306N used to form the semiconductor channel of the planar NFET 712N can increase the drive strength of the planar NFET 712N. For example, the tensile strain induced by the DDB 302 in the N-type semiconductor channel 710N in the N-type diffusion region 306N may increase the N-type device drive current between approximately five percent (5%) and twenty percent (20%). However, inducing tensile strain in the P-type diffusion region 306P that induces such tensile strain in the P-type semiconductor channel 710P formed in the P-type diffusion region 306P may degrade carrier mobility in the P-type semiconductor channel 710P. This would, for example, have the effect of reducing drive strength of the planar PFET 712P employing the P-type semiconductor channel 710P in the circuit 700. This may not be desired. Thus, as described with regard to the circuit 300 in FIGS. 3A-3C, the SDB 304 is formed in the P-type diffusion region 306P of the circuit 300, as opposed to expanding the DDB 302 formed in the N-type diffusion region 306N also into the P-type diffusion region 306P. This can avoid inducing and/or reducing tensile stress applied to the P-type diffusion region 306P and the P-type semiconductor channel 710P formed therein so as to lessen or avoid reducing carrier mobility in the P-type semiconductor channel 710P and the planar PFET 712N.

The exemplary fabrication processes of the circuit 300 in FIG. 4 and FIGS. 5A-1-5G-3 can be employed to form the DDB 302 and SDB 304 in the circuit 700 in FIGS. 7A-7C.

In another exemplary aspect, if a DDB will induce a compressive strain in the diffusion regions of the circuit, a DDB can be formed in the P-type diffusion region(s) of the circuit, and a SDB formed in the N-type diffusion region(s) of the circuit, opposite of the circuit 300 in FIGS. 3A-3C. Inducing compressive strain in the P-type diffusion region(s) can increase carrier mobility of a semiconductor channel of a P-type semiconductor device(s) formed in the P-type diffusion region(s), but reduce carrier mobility in a semiconductor channel of a N-type semiconductor device(s). Thus, in this aspect, a SDB is formed in the N-type diffusion region(s) to avoid inducing or reducing tensile stress to the N-type diffusion region(s) so as to not reduce carrier mobility of a N-type semiconductor device(s) formed in the N-type diffusion region(s) that may result from a DDB.

Figure 8A:
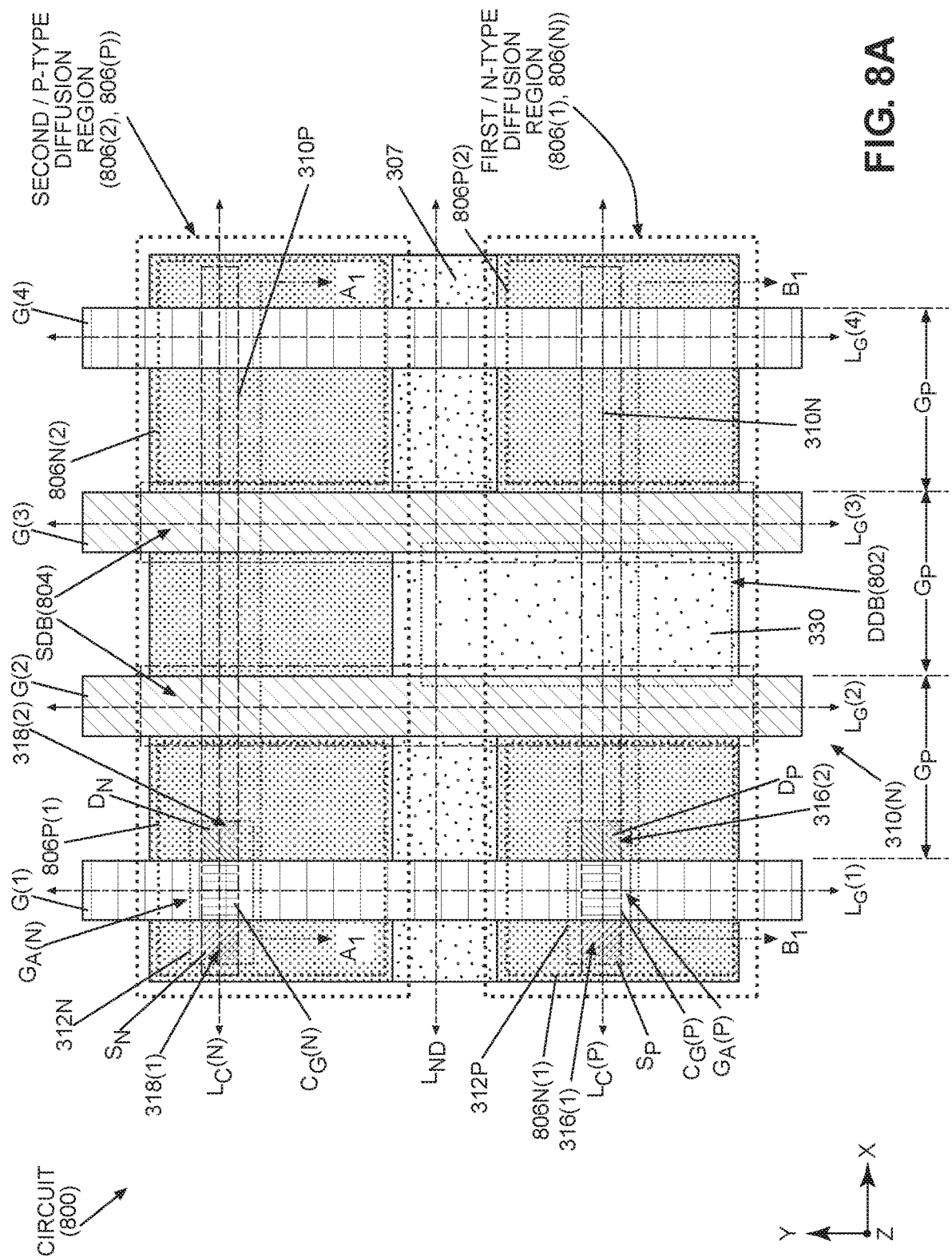
FIG. 8A is a top view of a circuit employing a DDB in a P-type diffusion region of a circuit to induce compressive stress in the P-type diffusion region, and a SDB in an N-type diffusion region of the circuit to increase carrier mobility in semiconductor device(s) formed in the P-type diffusion region(s), while reducing or avoiding the degradation of carrier mobility in semiconductor device(s) formed in the N-type diffusion region.
Figure 8B:
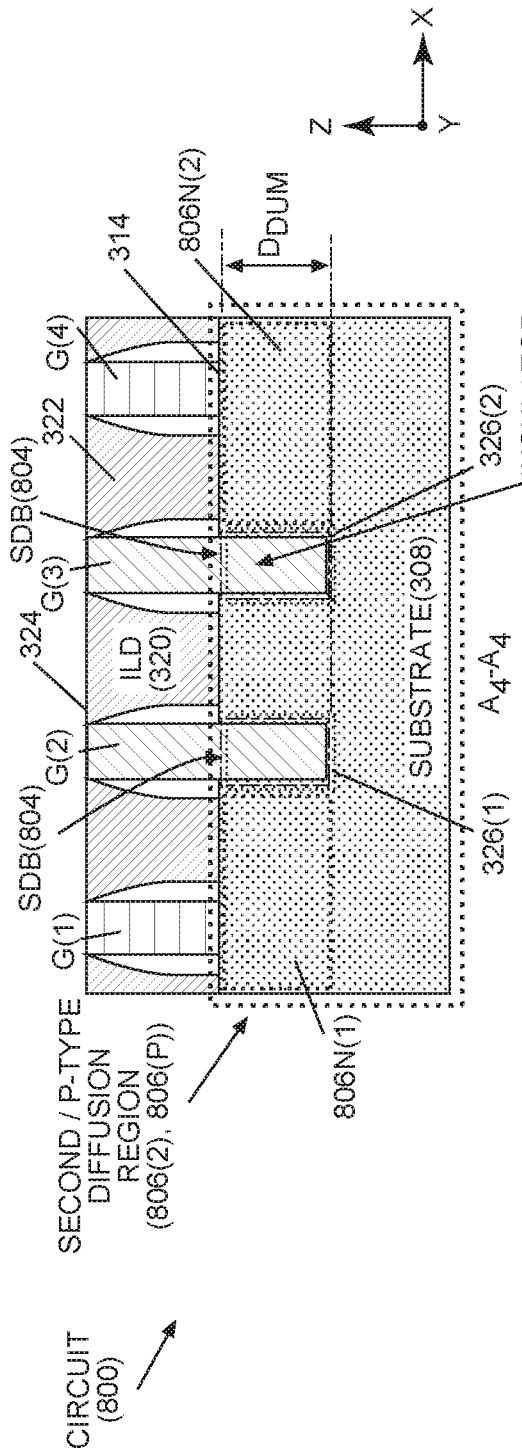
FIGS. 8B and 8C are cross-sectional views taken in respective, different cross-sections of P-type and N-type diffusion regions in the circuit in FIG. 3A to further illustrate the DDB in the P-type diffusion region and SDB in the N-type diffusion region.
Figure 8C:
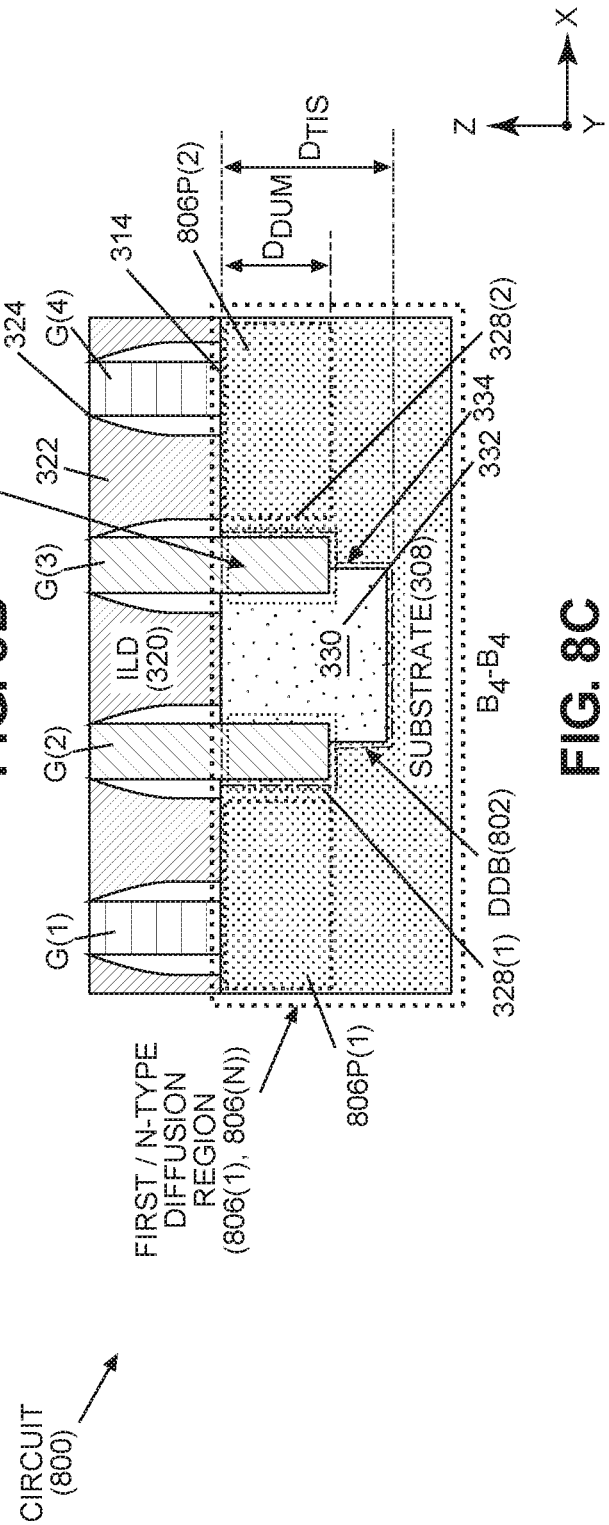

In this regard, FIGS. 8A-8C illustrate an exemplary circuit 800 employing a DDB 802 and a SDB 804 in respective, different types of first and second diffusion regions 806(1), 806(2) to increase carrier mobility in a FET(s) formed in the circuit 800. FIG. 8A is a top view of the circuit 800. FIGS. 3B and 3C are cross-sectional views taken in respective cross-sections $A_4$-$A_4$, $B_4$-$B_4$ of the circuit 800 in FIG. 8A to further illustrate the DDB 802 in the first diffusion region 806(1) and the SDB 804 in the second diffusion region 806(2). Common elements and components between the circuit 300 in FIGS. 3A-3C and the circuit 800 in FIGS. 8A-8C are shown with common element numbers or labeling and thus will not be re-described.

In this example of the circuit 800 in FIGS. 8A-8C, the first diffusion region 806(1) is a P-type diffusion region 806(1) (also labeled "806P"), and the second diffusion region is an N-type diffusion region 806(2) (also labeled "806N"). For example, the N-type diffusion region 806N may be formed by doping a portion a semiconductor substrate 308 (e.g., Silicon (Si)) with a pentavalent impurity material as a donor material that is able to give up free electrons in the substrate 308. Likewise as an example, the P-type diffusion region 806P may be formed by doping a portion a semiconductor substrate 308 with an impurity material is able to leave holes in the substrate 308. In this example, the DDB 802 is formed in the P-type diffusion region 806P, and the SDB 804 is formed in the N-type diffusion region 806N. Also note that the P-type diffusion region 806P is formed in the circuit 800 according to a circuit cell as one diffusion region, but is separated into two P-type diffusion sub-regions 806P(1), 806P(2) by the DDB 802. Likewise, note that the N-type diffusion regions 806N is formed in the circuit 800 according to a circuit cell as one diffusion region, but is separated into two N-type diffusion sub-regions 806N(1), 806N(2) by the SDB 804. Also note that there is the non-diffusion region 307 having a longitudinal axis $L_{ND}$ in the X-axis direction between the P-type diffusion region 806P and the N-type diffusion region 806N in the circuit 800.

As shown in FIG. 8A, 3D N-type FET (NFET) 312N in the form of a FinFET in this example is formed in the N-type diffusion region 806N by forming a source $S_N$ and drain $D_N$ on opposites sides of the active gate G(1) in the N-type diffusion region 306N. Similarly, as shown in FIG. 8A, a 3D PFET 312P also the form of a FinFET in this example is formed in the P-type diffusion region 806P by forming a source $S_P$ and drain $D_P$ on opposites sides of the active gate G(1) in the P-type diffusion region 806P.

With continuing reference to FIGS. 8A-8C, the DDB 802 is formed in the P-type diffusion region 806P of the circuit 800 in this example, because the DDB 802 induces a compressive strain in the P-type diffusion region 806P during fabrication of the circuit 800. Inducing tensile strain in the P-type diffusion region 806P can increase carrier mobility of the P-type semiconductor channel 310P formed in the N-type diffusion region 806N. Thus for example, the tensile strain induced in the P-type semiconductor channel 310P formed in the P-type diffusion region 806P used to form the semiconductor channel of the PFET 812P can increase the drive strength of the PFET 812NP. For example, the compressive strain induced by the DDB 802 in the P-type semiconductor channel 310P in the P-type diffusion region 806P may increase the P-type device drive current between approximately five percent (5%) and twenty percent (20%). However, inducing compressive strain in the N-type diffusion region 806N that induces such tensile strain in the N-type semiconductor channel 310N formed in the N-type diffusion region 806N may degrade carrier mobility in the N-type semiconductor channel 310N. This would, for example, have the effect of reducing drive strength of the NFET 812N employing a N-type semiconductor channel 310N in the circuit 800. This may not be desired. Thus, in this example, the SDB 804 is formed in the N-type diffusion region 806N of the circuit 800, as opposed to expanding the DDB 802 formed in the P-type diffusion region 806P also into the N-type diffusion region 806N. This can avoid inducing and/or reducing compressive stress applied to the N-type diffusion region 806N and the P-type semiconductor channel 310P formed therein so as to lessen or avoid reducing carrier mobility in the P-type semiconductor channel 310P and the NFET 812N.

In this manner, the DDB 802 can be formed in the circuit 800 in FIGS. 8A-8C to purposefully induce compressive strain in the P-type diffusion region 806P and the N-type semiconductor channel 310N formed therein to increase drive strength of PFETs formed in the P-type diffusion region 806P, such as PFET 812P. However, reducing carrier mobility of the N-type semiconductor channel 310N in the N-type diffusion region 806N may be avoided to avoid decreasing the drive strength of NFETs, such as NFET 812N, formed in the N-type diffusion region 806N. Additional aspects of the circuit 800 in FIGS. 8A-8C are discussed above with regard to the circuit 300 in FIGS. 3A-3C and thus are not re-described. The exemplary fabrication processes of the circuit 300 in FIG. 4 and FIGS. 5A-1-5G-3 can be employed to form circuit 700 in FIGS. 8A-8C.

In another exemplary aspect, a circuit is provided. The circuit includes the substrate 308 comprising the top surface 314 as shown in the exemplary circuits 300, 600, 700, and 800 in FIGS. 3A-3C, 6A-6C, 7A-7C, and 8A-8C. The circuit includes a means for providing a first diffusion in the substrate, the means for providing the first diffusion comprising either a means for providing a P-type diffusion in the substrate or a means for providing an N-type diffusion in the substrate. An example of the means for providing a first diffusion in the substrate can be either the P-type diffusion region 306P or N-type diffusion region 306N in FIGS. 3A-3C, 6A-6C, and 7A-7C, or the P-type diffusion region 806P or N-type diffusion region 806N in FIGS. 8A-8C. The circuit also includes that the means for providing the first diffusion comprising at least one first means for providing a semiconducting channel. An example of the means for providing a semiconducting channel can include the N-type and P-type semiconductor channels 310N, 310P in the circuit 300 in FIGS. 3A-3C, the N-type and P-type semiconductor channels N, 610P in the circuit 600 in FIGS. 6A-6C, the N-type and P-type semiconductor channels 710N, 710P in the circuit 700 in FIGS. 7A-7C, or the N-type and P-type semiconductor channels 310N, 310P in the circuit 800 in FIGS. 8A-8C. The circuit includes a means for providing a second diffusion in the substrate, the means for providing the second diffusion comprising either a means for providing an N-type diffusion in the substrate or a means for providing a P-type diffusion in the substrate. An example of the means for providing a second diffusion in the substrate can be either the N-type diffusion region 306N or P-type diffusion region 306P in the circuits 300, 600, 700 in FIGS. 3A-3C, 6A-6C, and 7A-7C, or the N-type diffusion region 806N or P-type diffusion region 806P in the circuit 800 in FIGS. 8A-8C. The circuit also includes that the means for providing the second diffusion comprising at least one second means for providing a semiconducting channel. An example of the second means for providing a semiconducting channel can include the N-type and P-type semiconductor channels 310N, 310P in the circuit 300 in FIGS. 3A-3C, the N-type and P-type semiconductor channels 710N, 710P in the circuit 600 in FIGS. 6A-6C, the N-type and P-type semiconductor channels 710N, 710P in the circuit 700 in FIGS. 7A-7C, or the N-type and P-type semiconductor channels 310N, 310P in the circuit 800 in FIGS. 8A-8C. The circuit also includes a means for providing a second diffusion in the substrate, the means for providing the second diffusion comprising either a means for providing a P-type diffusion in the substrate or a means for providing an N-type diffusion in the substrate. The circuit also includes a means for controlling conduction in at least one of the at least one first means for providing a semiconducting channel, and the at least one second means for providing a semiconducting channel. An example of the means for controlling conduction in at least one of the at least one first means for providing a semiconducting channel, and the at least one second means for providing a semiconducting channel can include the gates G(1), G(4) in the circuits 300, 600, 700, 800 in FIGS. 3A-3C, 6A-6C, 7A-7C, and 8A-8C. The circuit can also include a first means for providing isolation adjacent to the active gate by a gate pitch, and a second means for providing isolation adjacent to the first means for providing isolation by the gate pitch, examples of which include the dummy gates G(2), G(3) in the circuits 300, 600, 700, 800 in FIGS. 3A-3C, 6A-6C, 7A-7C, and 8A-8C. The circuit can also include a means for providing a DDB in the first diffusion region, an example of which includes the DDB 302 in the circuits 300, 600, 700 in FIGS. 3A-3C, 6A-6C, 7A-7C, and the DDB 802 in the circuit 800 in FIGS. 8A-8C. The means for providing a DDB can include a means for providing trench isolation between the first means for providing isolation and the second means for providing isolation, examples of which include the trench isolation structure 330 in the circuits 300, 600, 700, 800 in FIGS. 3A-3C, 6A-6C, 7A-7C, and 8A-8C, a portion of the first means for providing isolation in the means for providing the first diffusion, which can include portion 326(1) in the circuits 300, 600, 700, 800 in FIGS. 3A-3C, 6A-6C, 7A-7C, and 8A-8C, a portion of the second means for providing isolation in the means for providing the first diffusion, which can include portion 326(2) in the circuits 300, 600, 700, 800 in FIGS. 3A-3C, 6A-6C, 7A-7C, and 8A-8C. The circuit also includes a means for providing a SDB in the second diffusion region, which examples include the SDB 304 in the circuits 300, 600, 700 in FIGS. 3A-3C, 6A-6C, 7A-7C, and the SDB 804 in the circuit 800 in FIGS. 8A-8C. The means for providing a SDB in the second diffusion region includes a portion of the first means for providing isolation in first means for providing the second diffusion, which can include portion 326(2) in the circuits 300, 600, 700, 800 in FIGS. 3A-3C, 6A-6C, 7A-7C, and 8A-8C, and a portion of the second means for providing isolation in first means for providing the second diffusion, which can include which can include portion 326(2) in the circuits 300, 600, 700, 800 in FIGS. 3A-3C, 6A-6C, 7A-7C, and 8A-8C.

Circuits employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 9 illustrates an example of a processor-based system 900 that can include circuits 902 employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein. In this example, the processor-based system 900 may be formed as an IC 904 in a system-on-a-chip (SoC) 906. The processor-based system 900 includes a processor 908 that includes one or more central processor units (CPUs) 910, which may also be referred to as CPU or processor cores. The processor 908 may have cache memory 912 coupled to the processor(s) 908 for rapid access to temporarily stored data. As an example, the cache memory 912 could include circuits 902 employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein. The processor 908 is coupled to a system bus 914 and can intercouple master and slave devices included in the processor-based system 900. As is well known, the processor 908 communicates with these other devices by exchanging address, control, and data information over the system bus 914. For example, the processor 908 can communicate bus transaction requests to a memory controller 916 as an example of a slave device. Although not illustrated in FIG. 9, multiple system buses 914 could be provided, wherein each system bus 914 constitutes a different fabric.

Other master and slave devices can be connected to the system bus 914. As illustrated in FIG. 9, these devices can include a memory system 920 that includes the memory controller 916 and a memory array(s) 918, one or more input devices 922, one or more output devices 924, one or more network interface devices 926, and one or more display controllers 928, as examples. Each of the memory system 920, the one or more input devices 922, the one or more output devices 924, the one or more network interface devices 926, and the one or more display controllers 928 can include circuits 902 employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein. The input device(s) 922 can include any type of input device, including, but not limited to, input keys, switches, voice processors, etc. The output device(s) 924 can include any type of output device, including, but not limited to, audio, video, other visual indicators, etc. The network interface device(s) 926 can be any device configured to allow exchange of data to and from a network 930. The network 930 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 926 can be configured to support any type of communications protocol desired.

The processor 908 may also be configured to access the display controller(s) 928 over the system bus 914 to control information sent to one or more displays 932. The display controller(s) 928 sends information to the display(s) 932 to be displayed via one or more video processors 934, which process the information to be displayed into a format suitable for the display(s) 932. The display(s) 932 can include any type of display, including, but not limited to, a cathode ray tube (CRT), a liquid crystal display (LCD), a plasma display, a light emitting diode (LED) display, etc. The display controller(s) 928, display(s) 932, and/or the video processor(s) 934 can include circuits 902 employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein.

Figure 10:
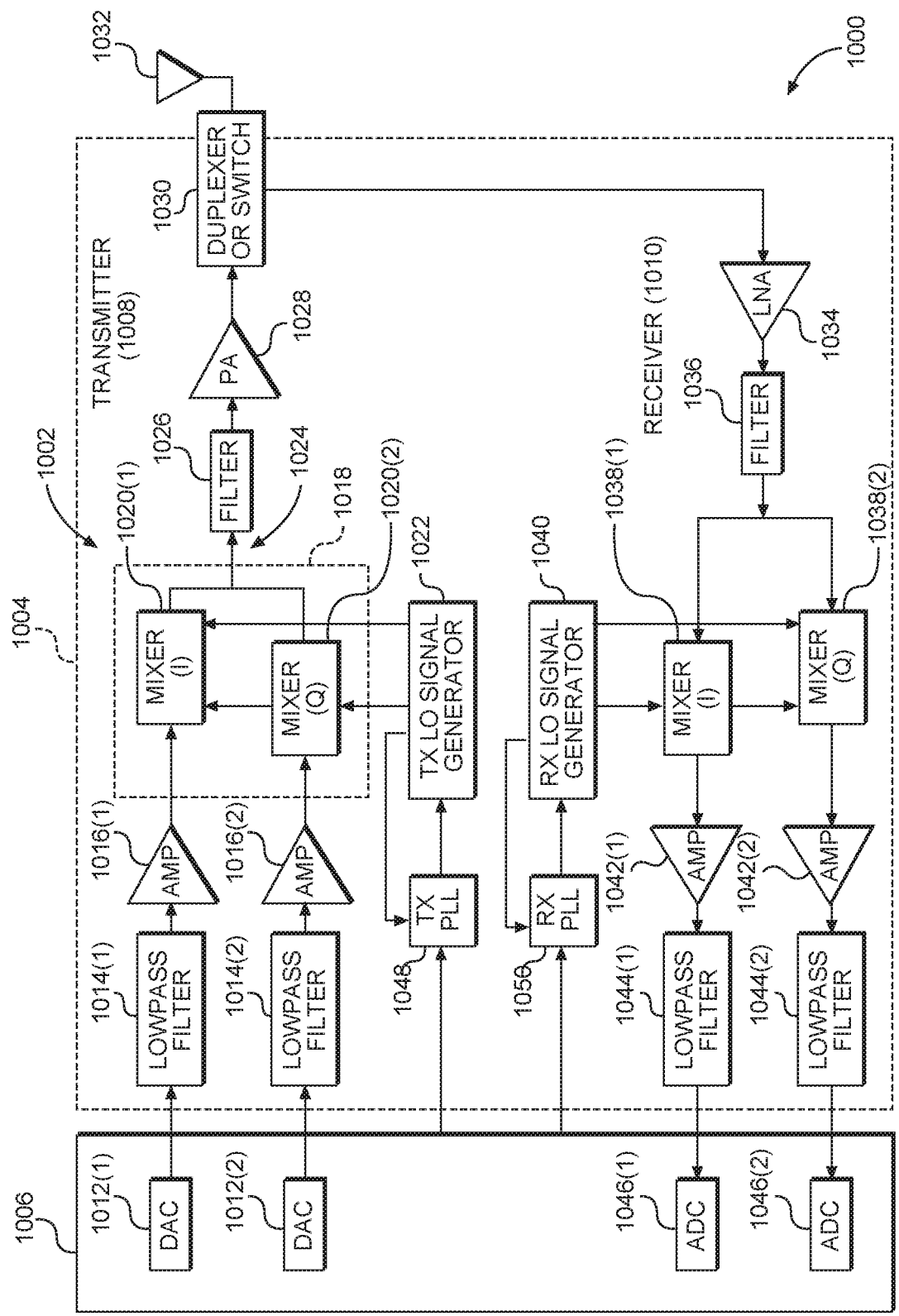
FIG. 10 is a block diagram of an exemplary wireless communications device that includes radio frequency (RF) components formed from an integrated circuit (IC), wherein any of the components therein can include a circuit employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuits in FIGS. 3A-3C, 6A-6C, 7A-7C, and 8A-8C.

FIG. 10 illustrates an exemplary wireless communications device 1000 that includes radio frequency (RF) components formed from an IC 1002, wherein any of the components therein can include circuits 1003 employing a DDB and a SDB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein. The wireless communications device 1000 may include or be provided in any of the above referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RF ICs (RFICs), mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012 (2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMP) 1016(1), 1016(2) amplify the signals from the lowpass filters 1014(1), 1014 (2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Downconversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by amplifiers (AMP) 1042(1), 1042(2) and further filtered by lowpass filters 1044(1), 1044(2) to obtain I and Q analog input signals, which are provided to the data processor 1006. In this example, the data processor 1006 includes ADCs 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit, comprising:
    a substrate comprising a top surface;
    a first diffusion region comprising either an N-type diffusion region or a P-type diffusion region disposed in the substrate,
        the first diffusion region comprising at least one first semiconductor channel each having a first longitudinal axis in a first direction;
    a second diffusion region comprising either a P-type diffusion region or an N-type diffusion region opposite of a diffusion type of the first diffusion region,
        the second diffusion region disposed in the substrate and comprising at least one second semiconductor channel each having a second longitudinal axis parallel to the first longitudinal axis;
    a first dummy gate extending along a third longitudinal axis orthogonal to the first longitudinal axis, the first dummy gate comprising a first dielectric material disposed above the first diffusion region and the second diffusion region, the first dielectric material extending from the top surface of the substrate to a first depth into the substrate;
    a second dummy gate extending along a fourth longitudinal axis parallel to the third longitudinal axis, the second dummy gate comprising a second dielectric material disposed above the first diffusion region and the second diffusion region, the second dielectric material extending from the top surface of the substrate to a second depth into the substrate, the second dummy gate adjacent to the first dummy gate by a gate pitch;
    a double diffusion break (DDB) in the first diffusion region, the DDB comprising:
        a trench isolation structure between the first dummy gate and the second dummy gate in the first direction;
        a portion of the first dummy gate in the first diffusion region; and
        a portion of the second dummy gate in the first diffusion region; and
    a single diffusion break (SDB) in the second diffusion region, the SDB comprising:
        a portion of the first dummy gate in the second diffusion region; and
        a portion of the second dummy gate in the second diffusion region.

2. The circuit of claim 1, wherein:
    the first diffusion region comprises a first N-type diffusion region; and
    the at least one first semiconductor channel comprises at least one first N-type semiconductor channel structure;
    the second diffusion region comprises a first P-type diffusion region; and the at least one second semiconductor channel comprises at least one second P-type semiconductor channel structure.

3. The circuit of claim 2, wherein the DDB is configured to induce a tensile strain in at least a portion of the at least one first semiconductor channel in the first diffusion region.

4. The circuit of claim 1, wherein:
the first diffusion region comprises a first P-type diffusion region; and
the at least one first semiconductor channel comprises at least one first P-type semiconductor channel structure;
the second diffusion region comprises a first N-type diffusion region; and
the at least one second semiconductor channel comprises at least one second N-type semiconductor channel structure.

5. The circuit of claim 4, wherein the DDB is configured to induce a compressive strain in at least a portion of the at least one first semiconductor channel in the first diffusion region.

6. The circuit of claim 1, wherein the substrate further comprises a non-diffusion region disposed along a fifth longitudinal axis between the first diffusion region and the second diffusion region in the first direction.

7. The circuit of claim 6, wherein the non-diffusion region comprises a trench isolation structure extending from the top surface of the substrate to a third depth into the substrate.

8. The circuit of claim 1, further comprising a first active gate extending above the first diffusion region and the second diffusion region along a fifth longitudinal axis orthogonal to the first longitudinal axis.

9. The circuit of claim 8, further comprising a second active gate extending above the first diffusion region and the second diffusion region along a sixth longitudinal axis parallel to the third longitudinal axis; and
wherein the first dummy gate is adjacent to the second active gate by the gate pitch.

10. The circuit of claim 1, further comprising an interlayer dielectric disposed above the first diffusion region, the second diffusion region, the first dummy gate, and the second dummy gate.

11. The circuit of claim 1, wherein the trench isolation structure extends from the top surface of the substrate to a third depth into the substrate.

12. The circuit of claim 10, wherein:
the first dummy gate in the first diffusion region of the DDB extends from a top surface of the interlayer dielectric, through the interlayer dielectric and from the top surface of the substrate to the first depth into the substrate; and
the second dummy gate in the first diffusion region of the DDB extends from the top surface of the interlayer dielectric, through the interlayer dielectric and from the top surface of the substrate to the second depth into the substrate.

13. The circuit of claim 10, wherein:
the first dummy gate in the second diffusion region of the SDB extends from a top surface of the interlayer dielectric, through the interlayer dielectric and from the top surface of the substrate to the first depth into the substrate; and
the second dummy gate in the second diffusion region of the SDB extends from the top surface of the interlayer dielectric, through the interlayer dielectric and from the top surface of the substrate to the second depth into the substrate.

14. The circuit of claim 9, further comprising:
a first Field-Effect Transistor (FET) in the first diffusion region, the first FET comprising:
a first gate comprising the first active gate;
a first semiconductor channel among the at least one first semiconductor channel;
a first source in a first end portion of the first semiconductor channel; and
a first drain in a second end portion of the first semiconductor channel; and
a second FET in the second diffusion region, the second FET comprising:
a second gate comprising the second active gate;
a second semiconductor channel among the at least one second semiconductor channel;
a second source in a first end portion of the second semiconductor channel; and
a second drain in a second end portion of the second semiconductor channel.

15. The circuit of claim 14, wherein:
the first FET comprises a first FinFET, wherein:
the first semiconductor channel extends above the top surface of the substrate; and
the first active gate is disposed around at least a portion of the first semiconductor channel; and
the second FET comprises a second FinFET, wherein:
the second semiconductor channel extends above the top surface of the substrate; and
the second active gate is disposed around at least a portion of the second semiconductor channel.

16. The circuit of claim 14, wherein:
the first FET comprises a first gate-all-around (GAA) FET, wherein:
the first semiconductor channel extends above the top surface of the substrate; and
the first active gate is disposed completely around the first semiconductor channel; and
the second FET comprises a second GAA FET, wherein:
the second semiconductor channel extends above the top surface of the substrate; and
the second active gate is disposed completely around the second semiconductor channel.

17. The circuit of claim 14, wherein:
the first FET comprises a first planar FET, wherein:
the first semiconductor channel is disposed in the substrate below the top surface of the substrate; and
the first active gate is disposed above the top surface of the substrate above the first semiconductor channel; and
the second FET comprises a second planar FET, wherein:
the second semiconductor channel is disposed in the substrate below the top surface of the substrate; and
the second active gate is disposed above the top surface of the substrate above the second semiconductor channel.

18. The circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

\* \* \* \* \*